United States Patent
Murakami et al.

(10) Patent No.: US 9,660,174 B2
(45) Date of Patent: May 23, 2017

(54) PIEZOELECTRIC MATERIAL AND PIEZOELECTRIC ELEMENT USING THE SAME, AND ELECTRONIC APPARATUS USING THE PIEZOELECTRONIC ELEMENT

(71) Applicants: CANON KABUSHIKI KAISHA, Tokyo (JP); UNIVERSITY OF YAMANASHI, Yamanashi (JP)

(72) Inventors: Shunsuke Murakami, Kawasaki (JP); Takayuki Watanabe, Yokohama (JP); Miki Ueda, Tokyo (JP); Nobuhiro Kumada, Kofu (JP)

(73) Assignees: CANON KABUSHIKI KAISHA, Tokyo (JP); UNIVERSITY OF YAMANASHI, Kofu-Shi (JP)

(*) Notice: Subject to any disclaimer, the term of this patent is extended or adjusted under 35 U.S.C. 154(b) by 168 days.

(21) Appl. No.: 14/420,135

(22) PCT Filed: Aug. 21, 2013

(86) PCT No.: PCT/JP2013/072927
§ 371 (c)(1),
(2) Date: Feb. 6, 2015

(87) PCT Pub. No.: WO2014/034692
PCT Pub. Date: Mar. 6, 2014

(65) Prior Publication Data
US 2015/0194594 A1 Jul. 9, 2015

(30) Foreign Application Priority Data
Aug. 27, 2012 (JP) .................. 2012-186643

(51) Int. Cl.
*H01L 41/187* (2006.01)
*H01L 41/18* (2006.01)
(Continued)

(52) U.S. Cl.
CPC .............. *H01L 41/183* (2013.01); *B06B 1/06* (2013.01); *B41J 2/14201* (2013.01);
(Continued)

(58) Field of Classification Search
CPC ............ C04B 35/62695; C04B 35/495; H01L 41/1878; H01L 41/1873
(Continued)

(56) References Cited

U.S. PATENT DOCUMENTS

| 8,632,723 | B2 | 1/2014 | Watanabe et al. |
| 8,698,380 | B2 | 4/2014 | Watanabe et al. |

(Continued)

FOREIGN PATENT DOCUMENTS

| CN | 102515762 A | 6/2012 |
| DE | 102010009461 A | 9/2011 |

(Continued)

OTHER PUBLICATIONS

Notification of the First Office Action in Chinese Application No. 201380044036.3 (Aug. 1, 2016).
(Continued)

*Primary Examiner* — J. San Martin
(74) *Attorney, Agent, or Firm* — Fitzpatrick, Cella, Harper & Scinto

(57) ABSTRACT

Provided is a lead-free piezoelectric material having a high Curie temperature, a satisfactory mechanical quality factor, and a satisfactory Young's modulus, and a piezoelectric element and a multilayered piezoelectric element each using the piezoelectric material. The piezoelectric material contains 0.04 mol % or more to 2.00 mol % or less of Cu with respect to 1 mol of a perovskite-type metal oxide represented by the following general formula: $(K_y Bi_w$
(Continued)

$Ba_{1-v-w)_{1-y}}Na_x(Nb_yTi_{1-y})O_3$ where relationships of $0<v\leq0.39$, $0<w\leq0.39$, $0.9\leq w/v\leq1.1$, $0.80\leq x\leq0.95$, and $0.85\leq y\leq0.95$ are satisfied.

23 Claims, 12 Drawing Sheets

(51) Int. Cl.
- *C04B 35/495* (2006.01)
- *H01L 41/43* (2013.01)
- *H01L 41/083* (2006.01)
- *H01L 41/273* (2013.01)
- *B41J 2/14* (2006.01)
- *C04B 35/626* (2006.01)
- *B06B 1/06* (2006.01)
- *G02B 27/00* (2006.01)
- *H02N 2/00* (2006.01)
- *H01L 41/047* (2006.01)

(52) U.S. Cl.
CPC ......... *B41J 2/14233* (2013.01); *C04B 35/495* (2013.01); *C04B 35/6261* (2013.01); *C04B 35/62695* (2013.01); *G02B 27/0006* (2013.01); *H01L 41/083* (2013.01); *H01L 41/1873* (2013.01); *H01L 41/1878* (2013.01); *H01L 41/273* (2013.01); *H01L 41/43* (2013.01); *H02N 2/001* (2013.01); *B41J 2202/03* (2013.01); *C04B 2235/3201* (2013.01); *C04B 2235/3215* (2013.01); *C04B 2235/3232* (2013.01); *C04B 2235/3234* (2013.01); *C04B 2235/3236* (2013.01); *C04B 2235/3251* (2013.01); *C04B 2235/3255* (2013.01); *C04B 2235/3281* (2013.01); *C04B 2235/3298* (2013.01); *C04B 2235/72* (2013.01); *C04B 2235/77* (2013.01); *C04B 2235/785* (2013.01); *C04B 2235/786* (2013.01); *C04B 2235/96* (2013.01); *H01L 41/0477* (2013.01)

(58) Field of Classification Search
USPC .......................................................... 310/358
See application file for complete search history.

(56) References Cited

U.S. PATENT DOCUMENTS

| | | | |
|---|---|---|---|
| 2006/0279901 A1* | 12/2006 | Miyamoto | C01G 29/00 361/272 |
| 2007/0120446 A1* | 5/2007 | Yamazaki | H01L 41/1873 310/358 |
| 2011/0074516 A1 | 3/2011 | Sone et al. | |
| 2013/0335488 A1* | 12/2013 | Watanabe | B41J 2/14233 347/70 |
| 2014/0152144 A1* | 6/2014 | Watanabe | C04B 35/495 310/311 |
| 2014/0265729 A1* | 9/2014 | Murakami | C04B 35/495 310/323.02 |
| 2014/0285070 A1* | 9/2014 | Glazunov | C04B 35/491 310/363 |
| 2015/0221856 A1* | 8/2015 | Ueda | C04B 35/495 347/70 |
| 2015/0368161 A1* | 12/2015 | Murakami | B41J 2/14233 252/62.9 PZ |
| 2015/0368162 A1* | 12/2015 | Hayashi | B41J 2/14233 252/62.9 PZ |

FOREIGN PATENT DOCUMENTS

| | | |
|---|---|---|
| JP | 2001-036990 A | 2/2001 |
| JP | 2005-008516 A | 1/2005 |
| JP | 2009-227535 A | 10/2009 |
| JP | 2011-184289 A | 9/2011 |

OTHER PUBLICATIONS

J.T. Zeng et al., "Ferroelectric and Piezoelectric Properties of Na1—xBaxNb1—xTixO3 Ceramics," 89(9) J. Am. Ceram. Soc. 2828-2832 (Jul. 2006).

Konjun Zhu et al., "Effects of CuO Doping on Properties of NaNbO3—BaTiO3 Lead-Free Piezoelectric Ceramics," 38 (6) Journal of the Chinese Ceramic Society 1031-1035 (Jun. 2010) (XP009159678).

Office Action in Taiwanese (ROC) Application No. 102130431 (issued Jan. 27, 2015).

Notice of Preliminary Rejection in Korean Application No. 10-2015-7007001 (mailed Aug. 17, 2016).

Notification of the Second Office Action in Chinese Application No. 201380044036.3 (Feb. 28, 2017).

Masato Matsubara et al., "Processing and Piezoelectric Properties of Lead-Free (K,Na) (Nb,Ta)O3 Ceramics," 88(5) J. Am. Ceram. Soc. 1190-1196 (Apr. 2005).

Notification of Reasons for Refusal in Japanese Application No. 2013-172828 (Feb. 28, 2017).

* cited by examiner

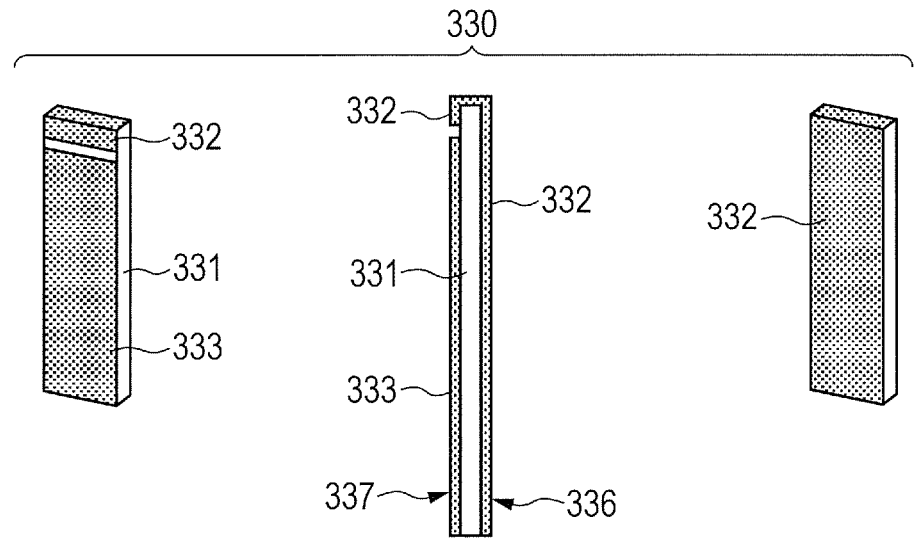
FIG. 10A   FIG. 10B   FIG. 10C
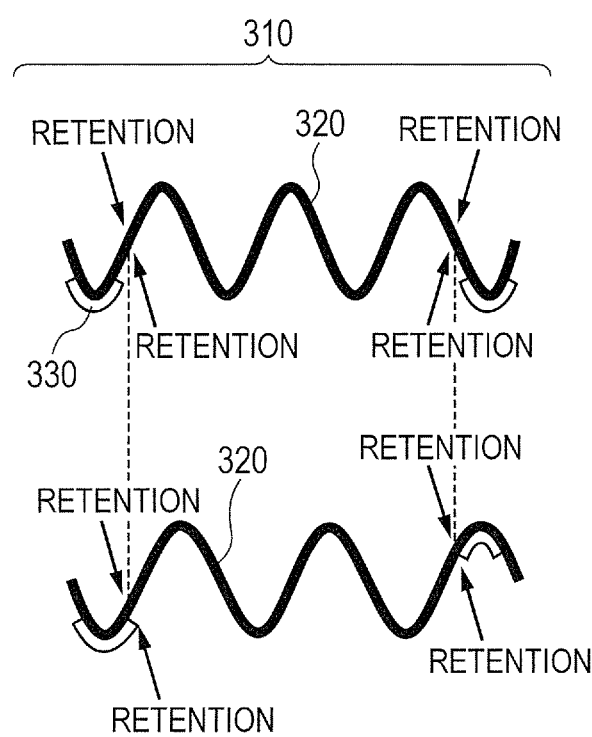
FIG. 11A
IN-PHASE
FIG. 11B
REVERSE PHASE

PIEZOELECTRIC MATERIAL AND PIEZOELECTRIC ELEMENT USING THE SAME, AND ELECTRONIC APPARATUS USING THE PIEZOELECTRONIC ELEMENT

TECHNICAL FIELD

The present invention relates to a piezoelectric material, and more particularly, to a lead-free piezoelectric material. The present invention also relates to a piezoelectric element, a multilayered piezoelectric element, a manufacturing method for a multilayered piezoelectric element, a liquid discharge head, a liquid discharge device, an ultrasonic motor, an optical device, a vibration device, a dust removing device, an imaging device, and an electronic apparatus, which use the piezoelectric material.

BACKGROUND ART

Lead zirconate titanate containing lead is a typical piezoelectric material, and is used in a variety of piezoelectric devices such as an actuator, an oscillator, a sensor, and a filter. However, it has been pointed out that, when a piezoelectric device containing lead is once scrapped and exposed to acid rain, the lead content in the piezoelectric material may be transferred into the soil to adversely affect the ecosystem. Accordingly, in order to exclude lead from piezoelectric devices, research and development on lead-free piezoelectric materials are actively conducted.

NPL 1 reports that when a small amount of barium titanate is dissolved in sodium niobate, which is an antiferroelectric, sodium niobate becomes a ferroelectric. Further, NPL 1 discloses remanent polarization, a coercive field, a piezoelectric constant, an electromechanical coupling coefficient, and a mechanical quality factor obtained when a piezoelectric material containing barium titanate at a concentration of 5% to 20% is sintered at 1,200 to 1,280° C. Further, the Curie temperature of the material in NPL 1 is higher than that (110 to 120° C.) of barium titanate, which is a typical lead-free piezoelectric material.

It is disclosed that the Curie temperature in a composition $(Na_{0.9}Ba_{0.1})(Nb_{0.9}Ti_{0.1})O_3$ at which the largest piezoelectric constant $d_{33}=143$ pC/N is obtained is 230° C.

On the other hand, there is a problem in that the mechanical quality factor in the composition $(Na_{0.9}Ba_{0.1})(Nb_{0.9}Ti_{0.1})O_3$, at which the largest piezoelectric constant $d_{33}=143$ pC/N is obtained in NPL 1, is 140, and this mechanical quality factor is lower than those of the other compositions.

In addition, PTL 1 discloses that the piezoelectric constant is improved by adding cobalt to piezoelectric ceramics as a solid solution of sodium niobate and barium titanate. On the other hand, the piezoelectric material of PTL 1 included a sample that is hardly polarized because of its low insulation property of $10^6 \Omega$ or less.

CITATION LIST

Patent Literature

PTL 1: Japanese Patent Application Laid-Open No. 2009-227535

Non Patent Literature

NPL 1: J. T. Zeng et al., "Journal of the American Ceramic Society," 2006, Volume 89, pp. 2828-2832

Technical Problem

In the conventional technology, in order to increase the Curie temperature of a piezoelectric material (hereinafter referred to as "NN-BT") obtained by dissolving barium titanate in sodium niobate, it is necessary to increase the ratio of sodium niobate and sinter the piezoelectric material at a temperature as high as 1,200 to 1,280° C. Further, in order to enhance the mechanical quality factor, the composition of NN-BT needs to be changed from $(Na_{0.9}Ba_{0.1})(Nb_{0.9}Ti_{0.1})O_3$, and in this case, there is a problem in that the piezoelectric constant decreases. Further, in order to enhance the piezoelectric constant, expensive cobalt, whose hazardous property has been pointed out, needs to be used, and in this case, there is a problem in that the insulation resistance of NN-BT with cobalt added thereto is not necessarily high.

The present invention has been made so as to solve the above-mentioned problems, and provides a piezoelectric material having a satisfactory mechanical quality factor and satisfactory insulation property that is free of lead and cobalt, has a Curie temperature of 200° C. or more, and can be sintered at a temperature of 1,150° C. or less. The present invention also provides a piezoelectric element, a multilayered piezoelectric element, a liquid discharge head, a liquid discharge device, an ultrasonic motor, an optical device, a vibration device, a dust removing device, an imaging device, and an electronic apparatus, which use the lead-free piezoelectric material.

Solution to Problem

In order to solve the above-mentioned problems, a piezoelectric material of the present invention includes 0.04 mol % or more to 2.00 mol % or less of Cu with respect to 1 mol of a perovskite-type metal oxide represented by the following general formula (1):

$$(K_vBi_wBa_{1-v-w})_{1-y}Na_x(Nb_yTi_{1-y})O_3 \qquad (1)$$

where relationships of $0<v\leq 0.39$, $0<w\leq 0.39$, $0.9\leq w/v\leq 1.1$, $0.80\leq x\leq 0.95$, and $0.85\leq y\leq 0.95$ are satisfied.

A piezoelectric element of the present invention includes at least: a first electrode; a piezoelectric material; and a second electrode, in which the piezoelectric material includes the piezoelectric material of the present invention.

A multilayered piezoelectric element of the present invention includes a piezoelectric material layer and an electrode layer including an internal electrode, which are alternately stacked, in which the piezoelectric material layer includes the piezoelectric material of the present invention. A manufacturing method for the multilayered piezoelectric element of the present invention includes at least: a step (A) of obtaining a slurry by dispersing a metal compound containing at least one kind of K, Bi, Ba, Na, Nb, Ti, and Cu; a step (B) of obtaining a compact from the slurry; a step (C) of forming an electrode on the compact; and a step (D) of obtaining a multilayered piezoelectric element by sintering a compact in which the compact containing the metal compound and the electrode are stacked alternately, the step (D) being performed at a sintering temperature of 1,150° C. or less.

A liquid discharge head of the present invention includes at least: a liquid chamber including a vibration portion including one of the piezoelectric element and the multilayered piezoelectric element; and an ejection port communicating to the liquid chamber.

A liquid discharge device of the present invention includes: a conveyance portion for a recording medium; and the liquid discharge head.

An ultrasonic motor of the present invention includes at least: a vibration body including one of the piezoelectric element and the multilayered piezoelectric element; and a moving body to be brought into contact with the vibration body.

An optical device of the present invention includes a drive portion including the ultrasonic motor.

A vibration device of the present invention includes a vibration body including one of the piezoelectric element and the multilayered piezoelectric element.

A dust removing device of the present invention includes a vibration portion including the vibration device.

An imaging device of the present invention includes at least: the dust removing device; and an image pickup element unit, in which a vibration member of the dust removing device and a light receiving plane of the image pickup element unit are sequentially disposed on the same axis.

An electronic apparatus of the present invention includes a piezoelectric acoustic component including one of the piezoelectric element and the multilayered piezoelectric element.

Further features of the present invention will become apparent from the following description of exemplary embodiments with reference to the attached drawings.

BRIEF DESCRIPTION OF DRAWINGS

FIGS. 10A, 10B, and 10C are schematic views each illustrating a configuration of a piezoelectric element in the dust removing device of the present invention.

FIGS. 11A and 11B are schematic diagrams each illustrating the principle of vibration of the dust removing device of the present invention.

DESCRIPTION OF EMBODIMENTS

Figure 1:
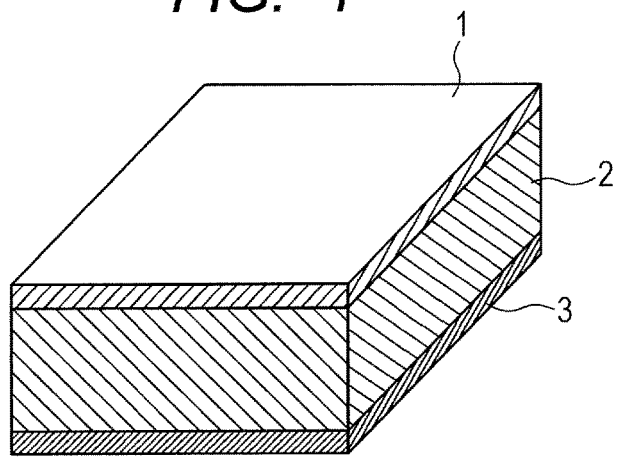
FIG. 1 is a schematic view illustrating a configuration of a piezoelectric element according to an embodiment of the present invention.

Embodiments for carrying out the present invention are described in the following.

The present invention provides a lead-free piezoelectric material that is based on NN-BT and has a high Curie temperature, a satisfactory mechanical quality factor, and satisfactory insulation property. Note that the piezoelectric material of the present invention may be used in various applications such as a capacitor, a memory, and a sensor, utilizing its property as a dielectric material.

The piezoelectric material of the present invention includes 0.04 mol % or more to 2.00 mol % or less of Cu with respect to 1 mol of a perovskite-type metal oxide represented by the following general formula (1):

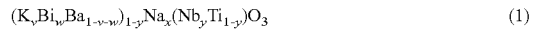

$$(K_v Bi_w Ba_{1-v-w})_{1-y} Na_x (Nb_y Ti_{1-y}) O_3 \quad (1)$$

(where relationships of $0<v\leq0.39$, $0<w\leq0.39$, $0.9\leq w/v\leq1.1$, $0.80\leq x\leq0.95$, and $0.85\leq y\leq0.95$ are satisfied).

In the present invention, the perovskite-type metal oxide refers to a metal oxide having a perovskite-type structure (sometimes referred to as "perovskite structure") that is ideally a cubic structure as described in Iwanami Rikagaku Jiten 5$^{th}$ Edition (published by Iwanami Shoten on Feb. 20, 1998). A metal oxide having a perovskite structure is generally represented by a chemical formula: $ABO_3$. In the perovskite-type metal oxide, elements A and B occupy specific positions in a unit cell, which are called an A site and a B site, respectively, in the form of ions. For example, in the case of a cubic unit cell, the A site element occupies the corners of a cubic, and the B site element occupies a body-centered position of the cubic. An oxygen (O) element occupies the face-centered positions of the cubic as an anion.

The metal oxide represented by the general formula (1) means that metal elements positioned at the A site are Na, K, Bi, and Ba, and metal elements positioned at the B site are Ti and Nb. Note that part of Na, K, Bi, and Ba may be positioned at the B site. Similarly, part of Ti and Nb may be positioned at the A site.

In the general formula (1), the molar ratio between the elements at the B site and the O element is 1:3, and the case where the ratio of element amounts is slightly shifted (for example, 1.00:2.94 to 1.00:3.06) also falls within the scope of the present invention as long as the metal oxide has a perovskite-type structure as a primary phase. It can be determined through, for example, structure analysis by X-ray diffraction and electron beam diffraction that the metal oxide has a perovskite-type structure.

The form of the piezoelectric material according to the present invention is not limited and may be any one of ceramics, powder, a monocrystal, a film, a slurry, and the like. In particular, it is preferred that the piezoelectric material be ceramics. The term "ceramics" as used herein refers to an aggregate (also referred to as "bulk body") of crystal grains, a so-called polycrystal, which contains a metal oxide as a basic component and is baked by a heat treatment. The ceramics include ones processed after sintering.

In the general formula (1), when x, which represents the abundance of Na at the A site, represents less than 0.80, Na becomes deficient with respect to the sum of Ti and Nb. Therefore, an impurity phase (phase having an X-ray diffraction pattern similar to that of $Ba_4Nb_2O_9$, $Ba_6Ti_7Nb_9O_{42}$, $Ba_3Nb_4Ti_4O_{21}$, $Ba_3Nb_{3.2}Ti_5O_{21}$, or the like) is generated. The resistivity of a metal oxide sample containing an impurity phase in a great amount is as low as $10^7$ to $10^8$ Ωcm, and hence it is difficult to polarize such metal oxide sample.

Further, when x represents more than 0.95, the piezoelectricity is degraded. When x falls within a range of $0.80 \leq x \leq 0.95$, the generation of an impurity phase can be suppressed and the piezoelectricity becomes satisfactory.

In the general formula (1), when y, which represents the amount of Nb at the B site, represents less than 0.85, the Curie temperature becomes lower than 140° C. On the other hand, when y represents more than 0.95, the piezoelectricity is degraded. Accordingly, when y Falls within a range of $0.85 \leq y \leq 0.95$, the Curie temperature becomes 140° C. or more, and the piezoelectricity becomes satisfactory.

y more preferably falls within a range of $0.85 \leq y \leq 0.90$ because the Curie temperature falls within a range of approximately 140° C. to 230° C., and the polarization treatment can be easily performed. y still more preferably falls within a range of $0.88 \leq y \leq 0.90$ because the Curie temperature falls within a range of approximately 190° C. to 230° C., the polarization treatment can be easily performed, and there is a low risk that the piezoelectric performance is degraded owing to heat in a device manufacturing step.

The Curie temperature refers to a temperature at or above which the piezoelectricity of the piezoelectric material is lost. Herein, the temperature at which the dielectric constant becomes a local maximum in the vicinity of a phase transition temperature between a ferroelectric phase and a paraelectric phase is defined as the Curie temperature.

$(Bi_{0.5}K_{0.5})TiO_3$ is a perovskite-type metal oxide having a tetragonal structure, and has a large c/a value of 1.024, which represents a ratio between an a-axis length and a c-axis length. Owing to this large tetragonal strain, the Curie temperature of a simple substance of $(Bi_{0.5}K_{0.5})TiO_3$ is as high as about 300° C. The Curie temperature can be increased by dissolving $(Bi_{0.5}K_{0.5})TiO_3$ in part of BT (c/a=1.01) of NN-BT through use of the above-mentioned property.

Further, it is known that Bi included in $(Bi_{0.5}K_{0.5})TiO_3$ has a 6 s lone electron pair and forms a strong covalent bond between Bi and O. The bonding force between a metal element and an oxygen element is enhanced by dissolving $(Bi_{0.5}K_{0.5})TiO_3$ in NN-BT, and the Curie temperature, which is a phase transition temperature, increases. However, when $(Bi_{0.5}K_{0.5})TiO_3$ is dissolved excessively, part of K reacts with Nb to change the structure of NN in NN-BT. As a result, the piezoelectric constant decreases, and the Curie temperature decreases.

When v and w, which represent the abundances of K and Bi, respectively, are more than 0.39 in the general formula (1), there is a risk in that the Curie temperature decreases and depolarization may occur owing to heating in a device manufacturing step and heat generation in device driving. Thus, when v and w fall within the ranges of $0 < v \leq 0.39$ and $0 < w \leq 0.39$, a high Curie temperature is obtained.

Further, it is more preferred that v and w fall within the ranges of $0 < v \leq 0.05$ and $0 < w \leq 0.05$ because the mechanical quality factor and the Young's modulus are enhanced more than those in the case of v=w=0.

The effect of the present invention is obtained by replacing part of BT in NN-BT by $(Bi_{0.5}K_{0.5})TiO_3$, and hence it is preferred that the values of v and w, which represent the abundances of K and Bi, respectively, be ideally the same. Note that, even when the values v and w are slightly different from each other, the properties of the piezoelectric material remain unchanged when the relationship of $0.9 \leq w/v \leq 1.1$ is satisfied.

When 0.04 mol % or more to 2.00 mol % or less of Cu is contained with respect to 1 mol of the perovskite-type metal oxide represented by the general formula (1), the resistivity, mechanical quality factor, Young's modulus, and density increase. Further, the firing temperature can be decreased. The sintering temperature refers to the lowest firing temperature required for obtaining a sintered body having a relative density of 95% or more.

Cu may be present at the A site (12-coordination), the B site (6-coordination), or at both the sites of the perovskite structure, or at the grain boundary of ceramics.

When a crystal containing sodium niobate as a component is sintered, Na evaporates or diffuses, and a sample composition after the sintering in which Na becomes insufficient with respect to Nb may be obtained. That is, defects occur at the A site. However, when an excess Na raw material is weighed at the time of weighing raw material powder, the insulation property of the sintered body is sometimes decreased. Accordingly, it is preferred that part of the added Cu occupy the A site to compensate for defects. In some cases, it is preferred that raw materials be weighed so that Na becomes insufficient in a range not exceeding 5% with respect to Nb in the composition after the sintering and Cu be added.

Further, Cu is not required to be present at any one of the A and B sites and may be present at the grain boundary. Cu accelerates liquid phase sintering owing to its low melting point. As a result, Cu is sometimes segregated at the grain boundary. When the liquid phase sintering is accelerated, pores in a sintered body decrease and the density of the sintered body increases. Further, as a result of the reduction of the pores, the mechanical quality factor increases and the Young's modulus increases. The distribution of Cu in a sample and an occupying site in a crystal can be evaluated even by an electron microscope, energy dispersion-type X-ray spectroscopy, X-ray diffraction, Raman scattering, or a transmission-type electron microscope.

When Cu is contained in an amount of more than 2.00 mol % with respect to 1 mol of the perovskite-type metal oxide, an impurity phase is generated to decrease piezoelectricity. On the other hand, when Cu is contained in an amount of less than 0.04 mol %, the insulation resistance degrades and the polarization treatment cannot be performed.

It is preferred that the piezoelectric material of the present invention satisfy a relationship of x<y in the general formula (1). When x is less than y, Cu is taken in the unit cell, and the resistivity, mechanical quality factor, Young's modulus, and density can be increased. Therefore, it is preferred that x be less than y. Further, it is preferred that the composition of starting materials be adjusted so that x becomes less than y. When x is equal to or more than y, there is a risk in that the insulation property of a sample may be degraded.

For the purposes of facilitating the manufacture of the piezoelectric material of the present invention and adjusting the physical properties of the piezoelectric material of the present invention, part of barium may be replaced by a divalent metallic element such as strontium or calcium. Similarly, part of niobium may be replaced by a pentavalent metallic element such as tantalum or vanadium.

In the case of forming the piezoelectric material of the present invention into a sintered body, a compact before being fired needs to be formed. The compact refers to a solid substance formed from raw material powder. It is preferred that raw material powder have higher purity. The mixing of Mg greatly influences the piezoelectric performance of a sample, and hence it is preferred to use a raw material in which the content of Mg is small, in particular. As a forming method, there may be given uniaxial pressing, cold isostatic pressing, hot isostatic pressing, slip casting, and extrusion molding.

When a compact is produced, it is preferred to use granulated powder. When the compact using the granulated powder is sintered, there is an advantage in that the size distribution of crystal grains of the sintered body is likely to be uniform.

No particular limitation is imposed on a method of granulating raw material powder of a piezoelectric material, and a spray drying method is the most preferred granulation method from such a viewpoint that the grain size of the granulated powder can be made more uniform.

Examples of the binder that may be used for granulation include polyvinyl alcohol (PVA), polyvinyl butyral (PVB), and an acrylic resin. The amount of the binder to be added is, with respect to the raw material power of the piezoelectric material, preferably 1 part by weight to 10 parts by weight, more preferably 2 parts by weight to 5 parts by weight from the viewpoint of increasing the density of a compact.

No particular limitation is imposed on a method of sintering the compact.

Examples of the sintering method include sintering using an electric furnace, sintering using a gas furnace, a conduction heating method, a microwave sintering method, a millimeter-wave sintering method, and hot isostatic pressing (HIP). The electric furnace and gas furnace for the sintering may be a continuous furnace or a batch furnace.

Although no particular limitation is imposed on the sintering temperature, when Cu is added to the perovskite-type metal oxide represented by the general formula (1), the piezoelectric material of the present invention can obtain sufficient piezoelectricity in a low-temperature process. For example, a conventional ceramics-like piezoelectric material made of NN-BT cannot obtain a sufficient density or sufficient piezoelectric performance unless it is sintered at a sintering temperature of 1,280° C. or more. However, the piezoelectric material of the present invention becomes piezoelectric ceramics having a sufficient density and sufficient piezoelectric performance when it is sintered at a sintering temperature of about 1,050° C. to 1,150° C.

In order to stabilize the properties of a piezoelectric material obtained by the sintering treatment with good reproducibility, it is appropriate that the sintering treatment is performed for 2 hours or more to 48 hours or less with the sintering temperature being set constant in the above-mentioned range. Further, a sintering method such as a two-stage sintering method may be used, and a method in which temperature does not change suddenly is preferred in consideration of the productivity.

It is preferred that the piezoelectric material obtained by the sintering treatment be subjected to a heat treatment at a temperature equal to or higher than the Curie temperature after being polished. When the piezoelectric material is mechanically polished, a residual stress is generated inside the piezoelectric material. However, when the piezoelectric material is subjected to a heat treatment at the Curie temperature or more, the residual stress is relieved, and the piezoelectric property of the piezoelectric material becomes more satisfactory. Although the heat treatment time is not particularly limited, 1 hour or more is preferred. When the crystal grain size of the piezoelectric material of the present invention is more than 100 µm, the strength may be poor in cutting and polishing. Further, when the crystal grain size is less than 0.3 µm, the piezoelectricity is degraded. Therefore, a preferred average grain size falls within a range of 0.3 µm or more to 100 µm or less. A more preferred average grain size falls within a range of 0.5 µm or more to 60 µm or less.

The "grain size" in the present invention refers to an "equivalent circular diameter of a projected area" generally called in a microscopic observation method and represents a diameter of a true circle having the same area as a projected area of a crystal grain. In the present invention, no particular limitation is imposed on a method of measuring the grain size. For example, the grain size can be determined by processing a photographic image obtained by photographing the surface of a piezoelectric material with a polarization microscope or a scanning electron microscope. An optimum magnification ratio varies depending on a grain size to be measured, and hence an optical microscope or an electron microscope may be used depending on the grain size to be measured. The equivalent circular diameter may be determined from an image of a polished surface or a cross-section instead of the surface of a material.

When the piezoelectric material of the present invention is used as a film formed on a substrate, it is desired that the thickness of the piezoelectric material be 200 nm or more to 10 µm or less, more preferably 300 nm or more to 3 µm or less. This is because, when the film thickness of the piezoelectric material is 200 nm or more to 10 µm or less, a sufficient electromechanical converting function as a piezoelectric element may be obtained.

The method of laminating the above-mentioned film is not particularly limited. For example, there are given chemical solution deposition (CSD), a sol-gel process, metalorganic chemical vapor deposition (MOCVD), sputtering, pulse laser deposition (PLD), hydrothermal synthesis, and aerosol deposition (AD). Of those, chemical solution deposition or sputtering is the most preferred laminating method. By chemical solution deposition or sputtering, the area of a film formed may be increased with ease.

It is preferred that the substrate used for the piezoelectric material of the present invention be a monocrystalline substrate cut and polished along a (001) plane or a (110) plane. With the use of a monocrystalline substrate cut and polished along a specific crystal plane, a piezoelectric material film formed on the surface of the substrate may also be strongly oriented in the same direction.

A piezoelectric element using the piezoelectric material of the present invention is described below.

FIG. 1 is a schematic view illustrating a configuration of a piezoelectric element according to an embodiment of the present invention. The piezoelectric element according to the present invention is a piezoelectric element including at least a first electrode 1, a piezoelectric material 2, and a second electrode 3, in which the piezoelectric material 2 is the piezoelectric material of the present invention.

The piezoelectric property of the piezoelectric material according to the present invention can be evaluated by forming the piezoelectric element including at least the first electrode and the second electrode. The first electrode and the second electrode are each formed of a conductive layer having a thickness of about 5 nm to 10 µm. A material therefor is not particularly limited and has only to be one to be generally used for a piezoelectric element. Examples thereof may include metals such as Ti, Pt, Ta, Ir, Sr, In, Sn, Au, Al, Fe, Cr, Ni, Pd, Ag, and Cu, and compounds thereof.

Each of the first electrode and the second electrode may be formed of one kind of those materials, or may be obtained by stacking two or more kinds thereof. The first electrode and the second electrode may be formed of different materials, respectively.

A manufacturing method for the first electrode and the second electrode is not limited. The first electrode and the second electrode may be formed by baking a metal paste or by sputtering, vapor deposition, or the like. In addition, both the first electrode and the second electrode may be patterned in desired shapes for use.

It is more preferred that the piezoelectric element have spontaneous polarization axes aligned in a certain direction. When the spontaneous polarization axes are aligned in a certain direction, the piezoelectric constant of the piezoelectric element increases.

A polarization method for the piezoelectric element is not particularly limited. The polarization treatment may be performed in the air or may be performed in an oil. A temperature at which the polarization is performed is preferably a temperature of 60° C. to 160° C. However, an optimum condition slightly varies depending on the composition of a piezoelectric material constituting the element. An electric field to be applied for performing the polarization treatment is preferably equal to or higher than the coercive field of the material, and is specifically 1 to 5 kV/mm.

The piezoelectric constant and electromechanical quality factor of the piezoelectric element may be determined by calculation, from the measurement results of a resonance frequency and an antiresonance frequency, which are obtained with a commercially available impedance analyzer, based on the standard of Japan Electronics and Information Technology Industries Association (JEITA EM-4501). This method is hereinafter referred to as resonance-antiresonance method.

Next, a multilayered piezoelectric element using the piezoelectric material of the present invention is described.

The multilayered piezoelectric element according to the present invention is a multilayered piezoelectric element including piezoelectric material layers and electrodes including an internal electrode stacked alternately, in which the piezoelectric material layers are formed of the piezoelectric material of the present invention.

Figure 2A:
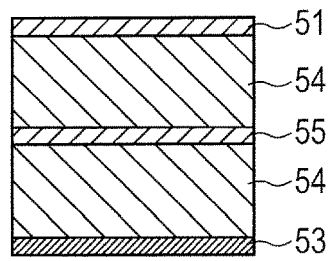
FIGS. 2A and 2B are schematic sectional views each illustrating a configuration of a multilayered piezoelectric element according to an embodiment of the present invention.
Figure 2B:
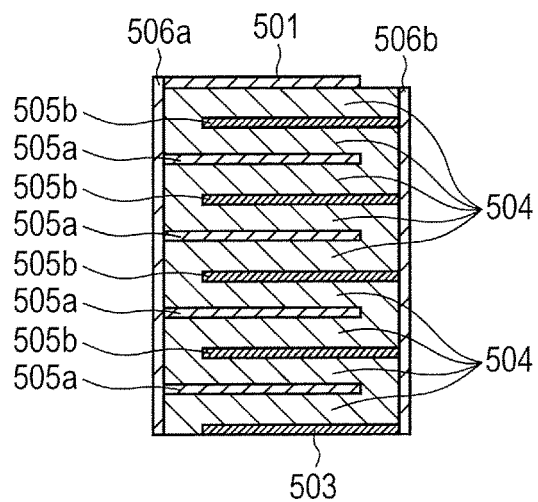

FIGS. 2A and 2B are schematic sectional views each illustrating a configuration of a multilayered piezoelectric element according to an embodiment of the present invention. The multilayered piezoelectric element according to the present invention is a multilayered piezoelectric element including piezoelectric material layers 54 and electrode layers including an internal electrode 55, the piezoelectric material layers and the electrode layers being stacked alternately, in which the piezoelectric material layers 54 are formed of the above-mentioned piezoelectric material. The electrodes may include external electrodes such as a first electrode 51 and a second electrode 53 in addition to the internal electrode 55.

FIG. 2A illustrates the configuration of the multilayered piezoelectric element of the present invention in which the piezoelectric material layers 54 of two layers and the internal electrode 55 of one layer are stacked alternately, and the multilayered structure is sandwiched between the first electrode 51 and the second electrode 53. However, as illustrated in FIG. 2B, the number of piezoelectric material layers and internal electrodes may be increased, and the number of the layers is not limited. The multilayered piezoelectric element of FIG. 2B has such a configuration that piezoelectric material layers 504 of nine layers and internal electrodes 505 (505a or 505b) of eight layers are stacked alternately, and the multilayered structure is sandwiched between a first electrode 501 and a second electrode 503, and has an external electrode 506a and an external electrode 506b for short-circuiting the alternately formed internal electrodes.

The internal electrodes 55, 505 and the external electrodes 506a, 506b do not need to be identical in size and shape to the piezoelectric material layers 54, 504, and may be divided into multiple portions.

The internal electrodes 55, 505, the external electrodes 506a, 506b, the first electrodes 51, 501, and the second electrodes 53, 503 are formed of a conductive layer having a thickness of about 5 nm to 10 μm. A material therefor is not particularly limited and has only to be one to be generally used for a piezoelectric element. Examples thereof may include metals such as Ti, Pt, Ta, Ir, Sr, In, Sn, Au, Al, Fe, Cr, Ni, Pd, Ag, and Cu and compounds thereof.

The internal electrodes 55, 505 and the external electrodes 506a, 506b may be formed of one kind thereof, may be formed of a mixture or alloy of two or more kinds thereof, or may be formed of a multilayered body of two or more kinds thereof. Further, multiple electrodes may be respectively formed of materials different from each other. From the viewpoint that an electrode material is inexpensive, it is preferred that the internal electrodes 55, 505 contain at least any one kind of Ni and Cu. When at least any one kind of Ni and Cu is used for the internal electrodes 55, 505, the multilayered piezoelectric element of the present invention is preferably fired in a reducing atmosphere.

In the multilayered piezoelectric element of the present invention, the internal electrode contains Ag and Pd, and a weight ratio M1/M2 between the content weight M1 of Ag and the content weight M2 of Pd is preferably 1.51≤M1/M2≤9.0, more preferably 2.3≤M1/M2≤4.0. A case where the weight ratio M1/M2 is less than 1.5 is not desired because the sintering temperature of the internal electrode increases. On the other hand, a case where the weight ratio M1/M2 is more than 9.0 is not desired because the internal electrode becomes island-shaped, resulting in in-plane non-uniformity.

As illustrated in FIG. 2B, multiple electrodes including the internal electrodes 505 may be short-circuited to each other for the purpose of making the phase of a driving voltage uniform. For example, the internal electrode 505a and the first electrode 501 may be short-circuited at the external electrode 506a. The internal electrode 505b and the second electrode 503 may be short-circuited at the external electrode 506b. The internal electrode 505a and the internal electrode 505b may be alternately disposed. Further, a mode in which the electrodes are short-circuited to each other is not limited. An electrode or wiring for short-circuit may be provided on a side surface of the multilayered piezoelectric element. Alternatively, the electrodes may be short-circuited to each other by providing a through-hole passing through the piezoelectric material layers 504 and providing a conductive material inside the through hole.

Next, a manufacturing method for the multilayered piezoelectric element using the piezoelectric material of the present invention is described.

A manufacturing method for a multilayered piezoelectric element according to the present invention includes at least: a step (A) of dispersing metal compound powder containing at least K, Bi, Ba, Na, Nb, Ti, and Cu to prepare a slurry; a step (B) of obtaining a compact from the slurry; a step (C) of forming an electrode on the compact; and a step (D) of sintering a compact in which the compact containing the metal compound powder and the electrode are stacked alternately to yield a multilayered piezoelectric element, the step (D) being performed at a sintering temperature of 1,150° C. or less. The metal compound powder may contain Cu.

The powder as used herein is intended to mean an aggregate of solid particles. The aggregate may be an aggregate of particles containing K, Bi, Ba, Na, Nb, Ti, and Cu simultaneously, or may be an aggregate of multiple kinds of particles containing any element.

Examples of the metal compound powder in the step (A) may include powders of a K compound, a Bi compound, a Ba compound, a Na compound, a Nb compound, a Ti compound, and a Cu compound.

Examples of the K compound that may be used include potassium carbonate, potassium nitrate, and bismuth potassium titanate.

Examples of the Bi compound that may be used include bismuth oxide, bismuth potassium titanate, bismuth chloride, bismuth bromide, bismuth nitrate, bismuth oxychloride, and bismuth hydroxide.

Examples of the Ba compound that may be used include barium oxide, barium carbonate, barium oxalate, barium acetate, barium nitrate, and barium titanate.

Examples of the Na compound that may be used include sodium carbonate, sodium niobate, and sodium tantalate.

Examples of the Nb compound that may be used include niobium oxide and sodium niobate.

Examples of the Ti compound that may be used include titanium oxide, barium titanate, barium zirconate titanate, and calcium titanate.

Examples of the Cu compound that may be used include copper (I) oxide, copper (II) oxide, copper carbonate, copper (II) acetate, and copper oxalate.

A preparation method for the slurry in the step (A) is exemplified. A solvent is added in a weight of 1.6 to 1.7-fold with respect to the metal compound powder, followed by mixing. As the solvent, for example, toluene, ethanol, a mixed solvent of toluene and ethanol, n-butyl acetate, or water may be used. The components are mixed in a ball mill for 24 hours. After that, a binder and a plasticizer are added.

Examples of the binder include polyvinyl alcohol (PVA), polyvinyl butyral (PVB), and an acrylic resin. When PVB is used as the binder, the solvent and PVB are weighed so that a weight ratio therebetween is, for example, 88:12.

Examples of the plasticizer include dioctyl sebacate, dioctyl phthalate, and dibutyl phthalate. When dibutyl phthalate is used as the plasticizer, equal weights of dibutyl phthalate and the binder are weighed. Then, the mixing in a ball mill is performed again overnight. The amounts of the solvent and the binder are adjusted so that the viscosity of the slurry is 300 to 500 mPa·s.

The compact in the step (B) is a sheet-shaped mixture of the metal compound powder, the binder, and the plasticizer. As a method of obtaining the compact in the step (B), for example, there is given sheet forming. For example, a doctor blade method may be employed for the sheet forming. The doctor blade method is a method of forming a sheet-shaped compact involving applying the slurry onto the base material with a doctor blade and drying the applied slurry.

As the base material, for example, a PET film may be used. It is desired that the surface of the PET film onto which the slurry is applied be coated with fluorine because the coating facilitates the peeling of the compact.

The drying may be natural drying or hot-air drying. The thickness of the compact is not particularly limited and may be adjusted depending on the thickness of the multilayered piezoelectric element. The thickness of the compact may be increased by, for example, increasing the viscosity of the slurry.

Manufacturing methods for the electrodes, that is, the internal electrodes 505a, 505b and the external electrodes 506a, 506b in the step (C) are not limited. The electrodes may be formed by baking a metal paste, or may be formed by, for example, sputtering, vapor deposition, or a printing method. For the purpose of reducing a driving voltage, the thickness and pitch interval of the piezoelectric material layers 504 are reduced in some cases. In that case, there is selected a process involving forming a multilayered body including a precursor for the piezoelectric material layers 504 and the internal electrodes 505a, 505b and then firing the multilayered body simultaneously. In that case, there is demanded an internal electrode material that does not undergo deformation and conductivity deterioration at a temperature required for sintering the piezoelectric material layers 504.

An inexpensive metal having a low melting point as compared to Pt, such as Ag, Pd, Au, Cu, or Ni, or an alloy thereof may be used for the internal electrodes 505 and the external electrodes 506a, 506b. In this connection, the external electrodes 506a, 506b may be formed after the firing of the multilayered body. In that case, Al or a carbon-based electrode material may be used in addition to Ag, Pd, Cu, or Ni.

A method of forming the electrode is desirably a screen printing method. The screen printing method is a method involving providing a screen printing plate on a compact provided on a base material and applying a metal paste with a spatula from above the screen printing plate. A screen mesh is formed on at least part of the screen printing plate. Thus, the metal paste at a portion on which the screen mesh is formed is applied onto the compact. The screen mesh in the screen printing plate desirably has a pattern formed therein. An electrode can be patterned onto the compact by transferring the pattern onto the compact through use of the metal paste.

The electrode is formed in the step (C) and then peeled from the base material. After that, one or multiple sheets of the compact are stacked and subjected to compression bonding. As a method for the compression bonding, there are given uniaxial pressing, cold isostatic pressing, and hot isostatic pressing. The hot isostatic pressing is desired because a pressure can be applied isotropically and uniformly. It is desired to heat the compact to around the glass transition temperature of the binder during the compression bonding because more satisfactory compression bonding can be achieved.

Multiple sheets of the compact can be stacked and subjected to compression bonding so as to achieve a desired thickness. For example, 10 to 100 sheets of the compact can be stacked and then subjected to thermocompression bonding involving applying a pressure of 10 to 60 MPa in a stacking direction over 10 seconds to 10 minutes at 50 to 80° C., to thereby stack the sheets of the compact. Further, multiple sheets of the compact may be aligned and stacked with good accuracy by putting alignment marks on electrodes. It should be appreciated that multiple sheets of the compact may also be stacked with good accuracy by providing a through-hole for positioning in the compact.

In the step (D), it is suitable that the sintering temperature be 1,150° C. or less because a metal having a low melting point and low cost as compared to Pt, such as Ag, Pd, Au, Cu, or Ni, or an alloy thereof may be used. When Ni or Cu is used for the electrode, the sintering in the step (D) is preferably performed in a reducing atmosphere.

In the manufacturing method for a multilayered piezoelectric element according to the present invention, the slurry preferably contains a perovskite-type metal oxide. Examples of the perovskite-type metal oxide include sodium niobate, barium titanate, and bismuth potassium titanate. The slurry may contain Cu, and in this case, copper (I) oxide or copper (II) oxide may be used.

The slurry suitably contains copper oxide because the grain growth is accelerated during sintering, and the density of the sintered body increases.

A liquid discharge head according to the present invention includes at least a liquid chamber having a vibration portion provided with the piezoelectric element or the multilayered piezoelectric element, and an ejection port communicating to the liquid chamber. No particular limitation is imposed on a liquid to be discharged by the liquid discharge head of the present invention as long as the liquid is a fluent material, and the liquid discharge head can discharge an aqueous liquid or a non-aqueous liquid, such as water, ink, or fuel.

Figure 3A:
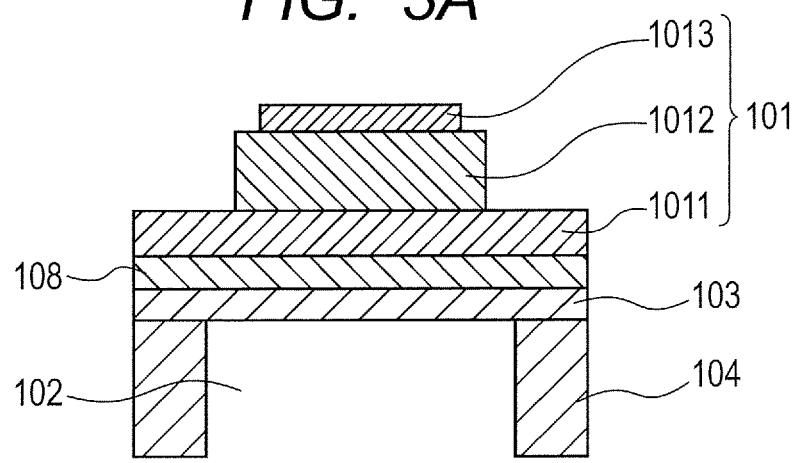
FIGS. 3A and 3B are schematic views each illustrating a configuration of a liquid discharge head according to an embodiment of the present invention.
Figure 3B:
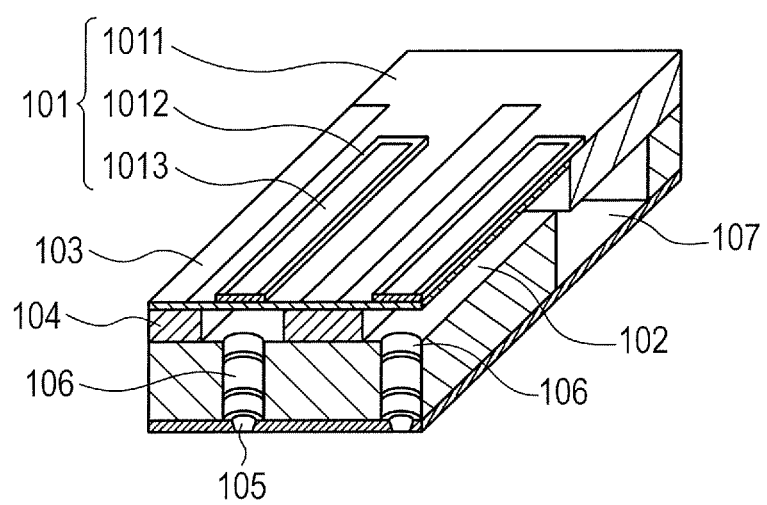

FIGS. 3A and 3B are schematic views each illustrating a configuration of the liquid discharge head according to an embodiment of the present invention. As illustrated in FIGS. 3A and 3B, the liquid discharge head of the present invention is a liquid discharge head having a piezoelectric element 101 of the present invention.

The piezoelectric element 101 includes at least a first electrode 1011, a piezoelectric material 1012, and a second electrode 1013. As illustrated in FIG. 3B, the piezoelectric material 1012 is patterned as necessary.

FIG. 3B is a schematic view of the liquid discharge head. The liquid discharge head includes ejection ports 105, individual liquid chambers 102, communicating holes 106 for connecting the individual liquid chambers 102 and the ejection ports 105, liquid chamber partition walls 104, a common liquid chamber 107, a diaphragm 103, and the piezoelectric elements 101. Each of the piezoelectric elements 101, which has a rectangular shape in FIG. 3B, may have a shape except the rectangular shape such as an elliptical shape, a circular shape, or a parallelogram shape. In general, the piezoelectric material 1012 has a shape in conformity with the shape of the individual liquid chamber 102.

The vicinity of the piezoelectric element 101 included in the liquid discharge head of the present invention is described in detail with reference to FIG. 3A. FIG. 3A is a sectional view of the piezoelectric element in the width direction of the liquid discharge head illustrated in FIG. 3B. The sectional shape of the piezoelectric element 101, which is illustrated in a rectangular shape, may be a trapezoidal shape or a reverse trapezoidal shape.

In FIG. 3A, the first electrode 1011 is used as the lower electrode, and the second electrode 1013 is used as the upper electrode. However, the arrangement of the first electrode 1011 and the second electrode 1013 is not limited to the foregoing. For example, the first electrode 1011 may be used as the lower electrode, or may be used as the upper electrode. Similarly, the second electrode 1013 may be used as the upper electrode, or may be used as the lower electrode. In addition, a buffer layer 108 may be present between the diaphragm 103 and the lower electrode. Note that, those differences in name depend on a manufacturing method for the device and an effect of the present invention can be obtained in any case.

In the liquid discharge head, the diaphragm 103 vertically fluctuates owing to the expansion and contraction of the piezoelectric material 1012 to apply a pressure to liquid in the individual liquid chamber 102. As a result, the liquid is discharged from the ejection port 105. The liquid discharge head of the present invention can be used in a printer application or the manufacture of an electronic apparatus. The diaphragm 103 has a thickness of 1.0 µm or more to 15 µm or less, preferably 1.5 µm or more to 8 µm or less. A material for the diaphragm 103, which is not limited, is preferably Si. Si for the diaphragm 103 may be doped with boron or phosphorus. In addition, the buffer layer and the electrode layer on the diaphragm 103 may serve as part of the diaphragm 103. The buffer layer 108 has a thickness of 5 nm or more to 300 nm or less, preferably 10 nm or more to 200 nm or less. The size of the ejection port 105 is 5 µm or more to 40 µm or less in terms of an equivalent circular diameter. The shape of the ejection port 105 may be a circular shape, or may be a star shape, a square shape, or a triangular shape.

Next, a liquid discharge device of the present invention is described. The liquid discharge device of the present invention includes a conveyance portion for a recording medium and the liquid discharge head.

Figure 4:
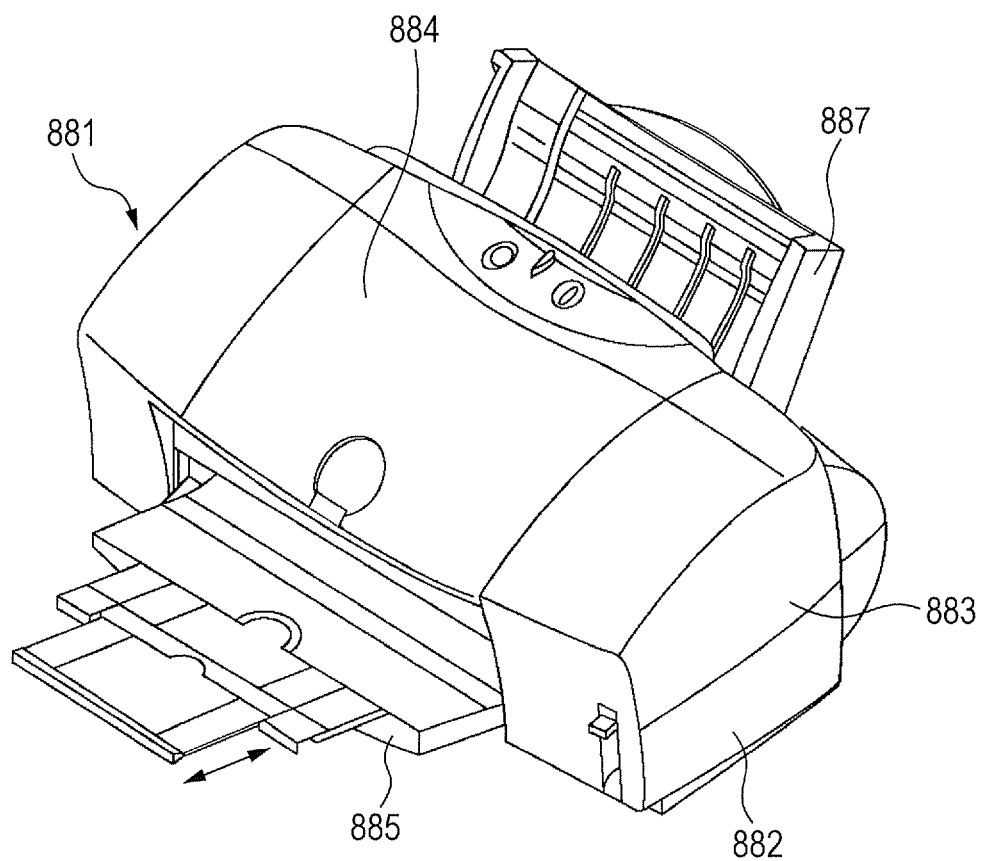
FIG. 4 is a schematic view illustrating a liquid discharge device according to an embodiment of the present invention.
Figure 5:
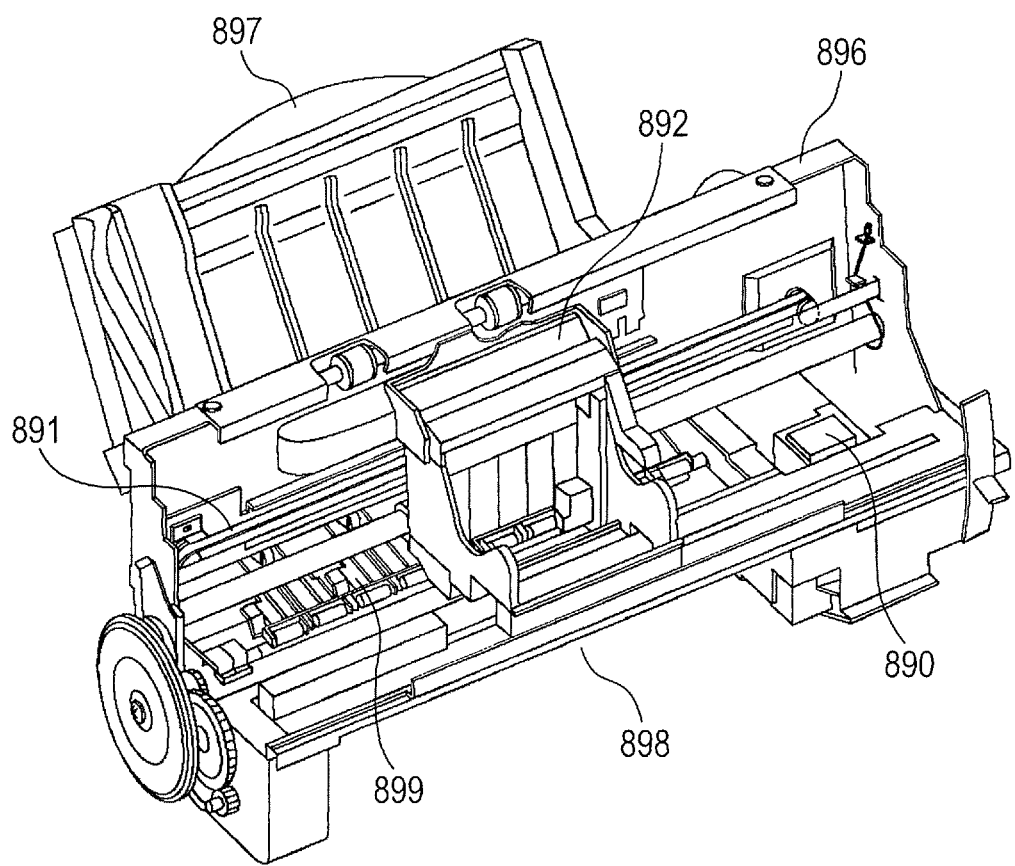
FIG. 5 is a schematic view illustrating the liquid discharge device according to the embodiment of the present invention.

As an example of the liquid discharge device of the present invention, there may be given an ink jet recording device illustrated in FIGS. 4 and 5. FIG. 5 illustrates a liquid discharge device (ink jet recording device) 881 illustrated in FIG. 4 in a state in which sheathings 882 to 885 and 887 thereof are removed. The ink jet recording device 881 includes an automatic sheet feeder portion 897 for automatically feeding recording sheets as recording media into a device main body 896. Further, the ink jet recording device 881 includes a conveyance portion 899 for guiding the recording sheet fed from the automatic sheet feeder portion 897 to a predetermined recording position and from the recording position to an exhaust port 898, a recording portion 891 for performing recording on the recording sheet conveyed to the recording position, and a recovery portion 890 for performing a recovery process on the recording portion 891. The recording portion 891 includes a carriage 892 that contains the liquid discharge head of the present invention and is reciprocated on a rail.

In such ink jet recording device, the carriage 892 is moved on the rail based on an electric signal sent from a computer, and a drive voltage is applied to electrodes sandwiching a piezoelectric material so that the piezoelectric material is displaced. This displacement of the piezoelectric material pressurizes each individual liquid chamber 102 via the diaphragm 103 illustrated in FIG. 3B, and hence ink is discharged from the ejection port 105 so as to perform printing. The liquid discharge device of the present invention can discharge liquid uniformly at high speed, and hence the device can be downsized.

In the example described above, the printer is exemplified. However, the liquid discharge device of the present invention can be used as a printing device such as an ink jet recording device including a facsimile, a multifunction peripheral, a copying machine, and the like, or as an industrial liquid discharge device or a drawing apparatus for an object.

An ultrasonic motor according to the present invention includes at least a vibration body provided with the piezoelectric element or the multilayered piezoelectric element, and a moving body to be brought into contact with the vibration body.

Figure 6A:
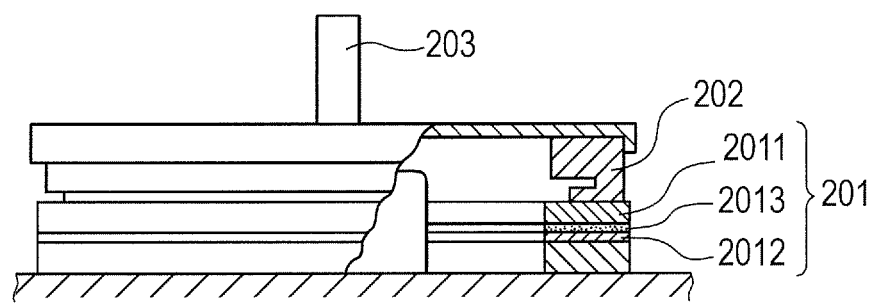
FIGS. 6A and 6B are schematic views each illustrating a configuration of an ultrasonic motor according to an embodiment of the present invention.
Figure 6B:
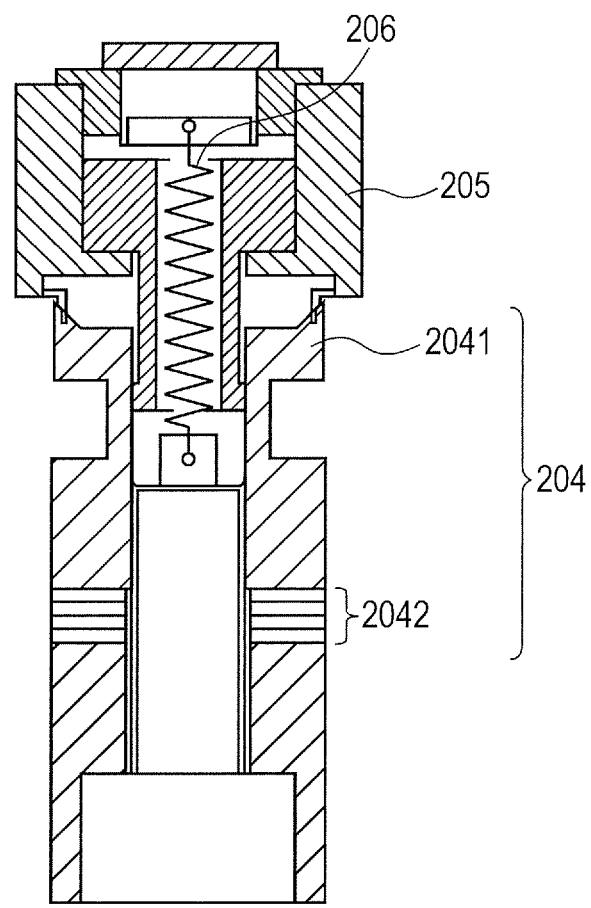

FIGS. 6A and 6B are schematic views each illustrating a configuration of the ultrasonic motor according to an embodiment of the present invention. FIG. 6A illustrates the ultrasonic motor in which the piezoelectric element of the present invention is formed of a single plate. The ultrasonic motor includes an oscillator 201, a rotor 202, which is brought into contact with the sliding surface of the oscillator 201 with a pressure applied from a pressurizing spring (not shown), and an output shaft 203 provided so as to be integral with the rotor 202.

The oscillator 201 is formed of a metal elastic ring 2011, a piezoelectric element 2012 of the present invention, and an organic adhesive 2013 for bonding the piezoelectric element 2012 to the elastic ring 2011 (such as an epoxy- or cyano-acrylate-based adhesive).

The piezoelectric element 2012 of the present invention is formed of a piezoelectric material sandwiched between a first electrode (not shown) and a second electrode (not shown). The application of two alternating voltages different from each other in phase by π/2 to the piezoelectric element of the present invention results in the generation of a flexural traveling wave in the oscillator 201, and hence each point on the sliding surface of the oscillator 201 undergoes an elliptical motion. When the rotor 202 is brought into press contact with the sliding surface of the oscillator 201, the rotor 202 receives a frictional force from the oscillator 201 to rotate in the direction opposite to the flexural traveling wave.

A body to be driven (not shown) is joined to the output shaft 203, and is driven by the rotary force of the rotor 202. The application of a voltage to the piezoelectric material results in the expansion and contraction of the piezoelectric material due to a transverse piezoelectric effect. When an elastic body such as a metal is joined to the piezoelectric element, the elastic body is bent by the expansion and contraction of the piezoelectric material. The ultrasonic motor of the kind described here utilizes this principle.

Next, an ultrasonic motor including a piezoelectric element having a multilayered structure is illustrated in FIG. 6B. An oscillator 204 is formed of a multilayered piezoelectric element 2042 sandwiched between tubular metal elastic bodies 2041. The multilayered piezoelectric element 2042 is an element formed of multiple stacked piezoelectric materials (not shown), and includes a first electrode and a second electrode on its outer surfaces of the stack, and internal electrodes on its inner surface of the stack. The metal elastic bodies 2041 are fastened with bolts so that the piezoelectric element 2042 may be sandwiched between and fixed by the bodies. Thus, the oscillator 204 is formed.

The application of alternating voltages different from each other in phase to the piezoelectric element 2042 causes the oscillator 204 to excite two vibrations orthogonal to each other. The two vibrations are combined to form a circular vibration for driving the tip portion of the oscillator 204. Note that, a constricted annular groove is formed in the upper portion of the oscillator 204 to enlarge the displacement of the vibration for driving. A rotor 205 is brought into contact with the oscillator 204 under a pressure from a spring 206 for pressurization to obtain a frictional force for driving. The rotor 205 is rotatably supported by a bearing.

Next, an optical device of the present invention is described. The optical device of the present invention includes a drive portion including the ultrasonic motor.

Figure 7A:
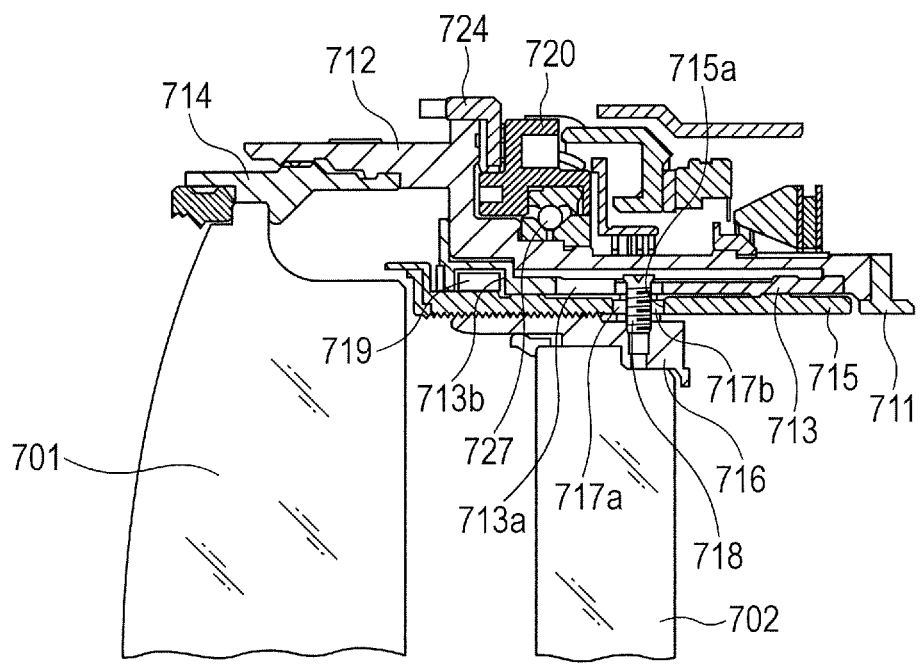
FIGS. 7A and 7B are schematic views each illustrating an optical device according to an embodiment of the present invention.
Figure 7B:
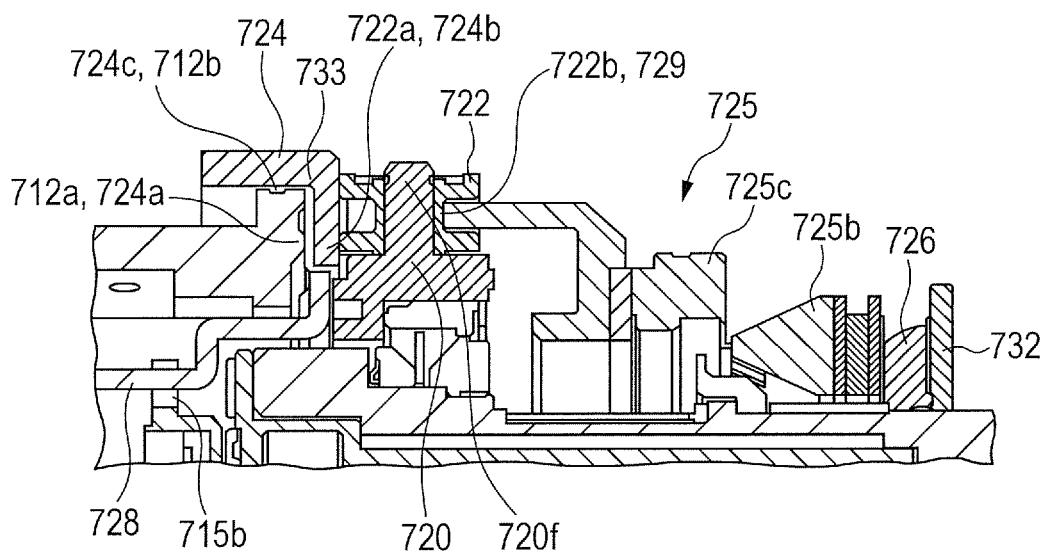
Figure 8:
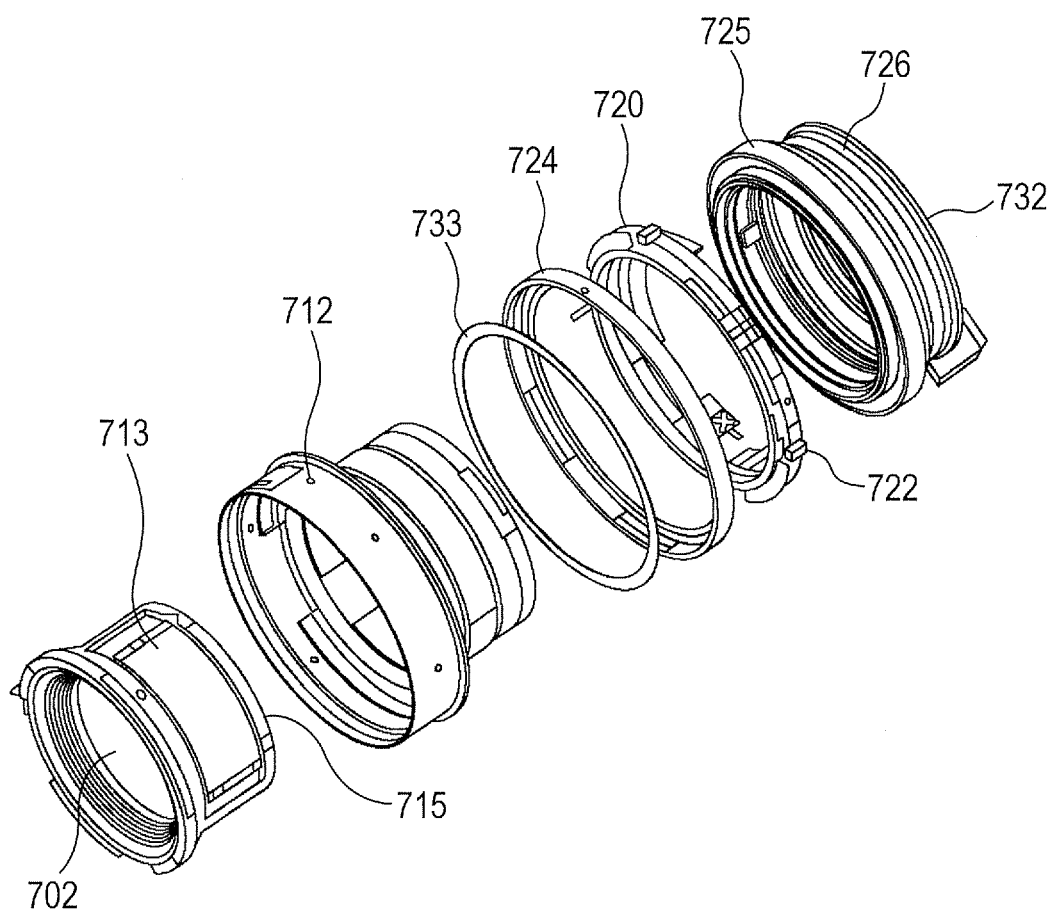
FIG. 8 is a schematic view illustrating the optical device according to the embodiment of the present invention.

FIGS. 7A and 7B are sectional diagrams of main parts of an interchangeable lens barrel for a single-lens reflex camera as an example of an imaging device according to a preferred embodiment of the present invention. In addition, FIG. 8 is an exploded perspective diagram of the interchangeable lens barrel for the single-lens reflex camera as the example of the imaging device according to the preferred embodiment of the present invention. A fixed barrel 712, a linear guide barrel 713, and a front unit barrel 714 are fixed to an attaching/detaching mount 711 for a camera. These are fixed members of the interchangeable lens barrel.

A linear guide groove 713a in an optical axis direction for a focus lens 702 is formed on the linear guide barrel 713. Cam rollers 717a and 717b protruding outward in a radial direction are fixed to a rear unit barrel 716 supporting the focus lens 702 via axial screws 718, and the cam roller 717a is fitted in the linear guide groove 713a.

A cam ring 715 is fitted on the inner periphery of the linear guide barrel 713 in a rotatable manner. Relative movement between the linear guide barrel 713 and the cam ring 715 in the optical axis direction is restricted because a roller 719 fixed to the cam ring 715 is fitted in an annular groove 713b of the linear guide barrel 713. A cam groove 715a for the focus lens 702 is formed on the cam ring 715, and the above-mentioned cam roller 717b is simultaneously fitted in the cam groove 715a.

On the outer peripheral side of the fixed barrel 712, there is disposed a rotation transmission ring 720 supported by a ball race 727 in a rotatable manner at a constant position with respect to the fixed barrel 712. The rotation transmission ring 720 has shafts 720f extending radially from the rotation transmission ring 720, and rollers 722 are supported by the shafts 720f in a rotatable manner. A large diameter part 722a of the roller 722 is brought into contact with a mount side end surface 724b of a manual focus ring 724. In addition, a small diameter part 722b of the roller 722 is brought into contact with a joining member 729. Six rollers 722 are disposed on the outer periphery of the rotation transmission ring 720 at uniform intervals, and each roller is provided in the relationship as described above.

A low friction sheet (washer member) 733 is disposed on an inner diameter part of the manual focus ring 724, and this low friction sheet is sandwiched between a mount side end surface 712a of the fixed barrel 712 and a front side end surface 724a of the manual focus ring 724. In addition, an outer diameter surface of the low friction sheet 733 is formed in a ring shape so as to be circumferentially fitted on an inner diameter part 724c of the manual focus ring 724. Further, the inner diameter part 724c of the manual focus ring 724 is circumferentially fitted on an outer diameter part 712b of the fixed barrel 712. The low friction sheet 733 has a role of reducing friction in a rotation ring mechanism in which the manual focus ring 724 rotates relatively to the fixed barrel 712 about the optical axis.

Note that, the large diameter part 722a of the roller 722 is brought into contact with the mount side end surface 724b of the manual focus ring in a state in which a pressure is applied by a pressing force of a waved washer 726 pressing an ultrasonic motor 725 to the front of the lens. In addition, similarly, the small diameter part 722b of the roller 722 is brought into contact with the joining member 729 in a state in which an appropriate pressure is applied by a pressing force of the waved washer 726 pressing the ultrasonic motor 725 to the front of the lens.

Movement of the waved washer 726 in the mount direction is restricted by a washer 732 connected to the fixed barrel 712 by bayonet joint. A spring force (biasing force) generated by the waved washer 726 is transmitted to the ultrasonic motor 725, and further to the roller 722, to be a force for the manual focus ring 724 to press the mount side end surface 712a of the fixed barrel 712. In other words, the manual focus ring 724 is integrated in a state in which the manual focus ring 724 is pressed to the mount side end surface 712a of the fixed barrel 712 via the low friction sheet 733.

Therefore, when a control unit (not shown) drives the ultrasonic motor 725 to rotate with respect to the fixed barrel 712, the rollers 722 rotate about the shafts 720f because the joining member 729 is brought into frictional contact with the small diameter parts 722b of the rollers 722. As a result of the rotation of the rollers 722 about the shafts 720f, the rotation transmission ring 720 rotates about the optical axis (automatic focus operation).

In addition, when a manual operation input portion (not shown) gives a rotation force about the optical axis to the manual focus ring 724, the rollers 722 rotate about the shafts 720f by friction force because the mount side end surface 724b of the manual focus ring 724 is brought into contact by pressure to the large diameter parts 722a of the rollers 722. When the large diameter parts 722a of the rollers 722 rotate about the shafts 720f, the rotation transmission ring 720 rotates about the optical axis. In this case, the ultrasonic motor 725 does not rotate because of a friction retaining force between a rotor 725c and a stator 725b (manual focus operation).

Two focus keys 728 are mounted to the rotation transmission ring 720 at opposing positions, and the focus key 728 is fitted to a notch portion 715b disposed on the tip of the cam ring 715. Therefore, when the automatic focus operation or the manual focus operation is performed so that the rotation transmission ring 720 is rotated about the optical axis, the rotation force is transmitted to the cam ring 715 via the focus key 728. When the cam ring is rotated about the optical axis, the rear unit barrel 716 whose rotation is restricted by the cam roller 717a and the linear guide groove 713a is moved forward and backward along the cam groove 715a of the cam ring 715 by the cam roller 717b. Thus, the focus lens 702 is driven, and the focus operation is performed.

In this case, the interchangeable lens barrel for the single-lens reflex camera is described above as the optical device of the present invention, but the present invention can be applied to any optical device including the drive portion including the ultrasonic motor, regardless of a type of the camera, including a compact camera, an electronic still camera, a personal digital assistant with camera, and the like.

A vibration device used for conveying or removing particles, powder, or liquid droplets is used widely for an electronic apparatus or the like.

Next, as an example of the vibration device of the present invention, a dust removing device using the piezoelectric element of the present invention is described.

A dust removing device according to the present invention includes a vibration body including a diaphragm including the piezoelectric element or the multilayered piezoelectric element.

Figure 9A:
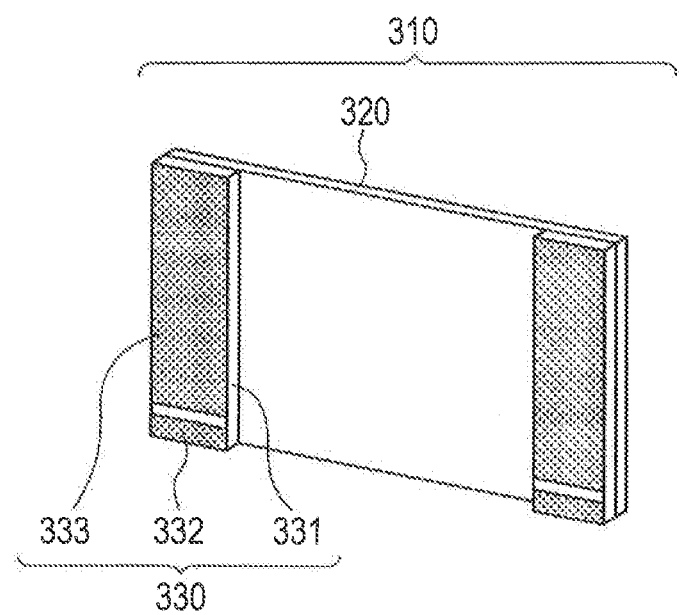
FIGS. 9A and 9B are schematic views each illustrating the case where a dust removing device is used as a vibration device according to an embodiment of the present invention.
Figure 9B:
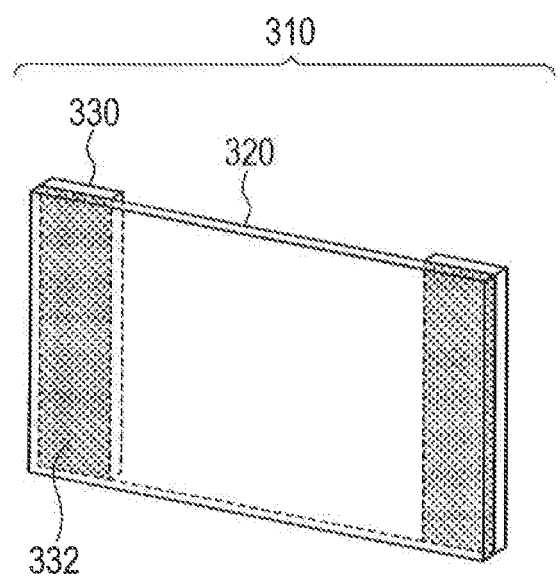

FIGS. 9A and 9B are schematic views each illustrating a dust removing device according to an embodiment of the present invention. A dust removing device 310 is formed of a plate-like piezoelectric element 330 and a diaphragm 320. The piezoelectric element 330 may be the multilayered piezoelectric element of the present invention. The material of the diaphragm 320 is not limited. In the case where the dust removing device 310 is used for an optical device, a transparent material or a reflective material can be used as the material of the diaphragm 320.

FIGS. 10A to 10C are schematic views illustrating a configuration of the piezoelectric element 330 illustrated in FIGS. 9A and 9B. FIGS. 10A and 10C illustrate a front surface configuration and a rear surface configuration of the piezoelectric element 330, respectively. FIG. 10B illustrates a side surface configuration. As illustrated in FIGS. 9A and 9B, the piezoelectric element 330 includes a piezoelectric material 331, a first electrode 332, and a second electrode 333. The first electrode 332 and the second electrode 333 are disposed so as to be opposed to each other on the plate planes of the piezoelectric material 331.

Similarly to FIGS. 9A and 9B, the piezoelectric element 330 may be the multilayered piezoelectric element of the present invention. In this case, the piezoelectric material 331 has an alternate structure of a piezoelectric material layer and an internal electrode and can provide driving waveforms different from each other in phase depending on the piezoelectric material layers by short-circuiting the internal electrode with the first electrode 332 or the second electrode 333 alternately.

The front plane of the piezoelectric element 330 illustrated in FIG. 10C, on which the first electrode 332 is disposed, is referred to as a first electrode plane 336. The front plane of the piezoelectric element 330 illustrated in FIG. 10A, on which the second electrode 333 is disposed, is referred to as a second electrode plane 337.

In this case, the electrode plane in the present invention means a plane of the piezoelectric element on which the electrode is disposed. For example, as illustrated in FIGS. 10A to 10C, the first electrode 332 may extend around to the second electrode plane 337.

As illustrated in FIGS. 9A and 9B, as for the piezoelectric element 330 and the diaphragm 320, the plate surface of the diaphragm 320 is fixed to the first electrode plane 336 of the piezoelectric element 330. When the piezoelectric element 330 is driven, a stress is generated between the piezoelectric element 330 and the diaphragm 320 so that out-of-plane oscillation is generated in the diaphragm. The dust removing device 310 of the present invention is a device that removes foreign matters such as dust sticking to the surface of the diaphragm 320 by the out-of-plane oscillation of the diaphragm 320. The out-of-plane oscillation means elastic oscillation in which the diaphragm is displaced in the optical axis direction, namely in the thickness direction of the diaphragm.

FIGS. 11A and 11B are schematic views illustrating a vibration principle of the dust removing device 310 of the present invention. FIG. 11A illustrates a state in which alternating electric fields having the same phase are applied to a pair of left and right piezoelectric elements 330 so that the out-of-plane oscillation is generated in the diaphragm 320. The polarization direction of the piezoelectric material forming the pair of left and right piezoelectric elements 330 is the same as the thickness direction of the piezoelectric elements 330, and the dust removing device 310 is driven by the seventh oscillation mode.

Figure 12:
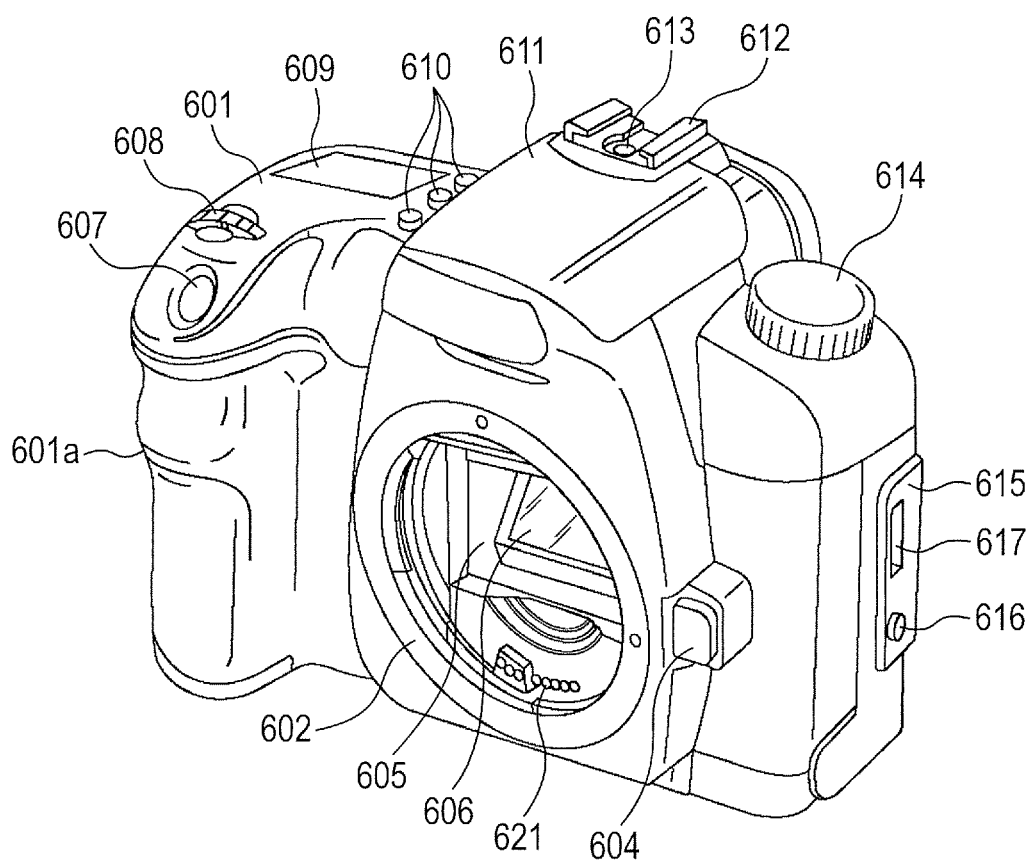
FIG. 12 is a schematic view illustrating an imaging device according to an embodiment of the present invention.
Figure 13:
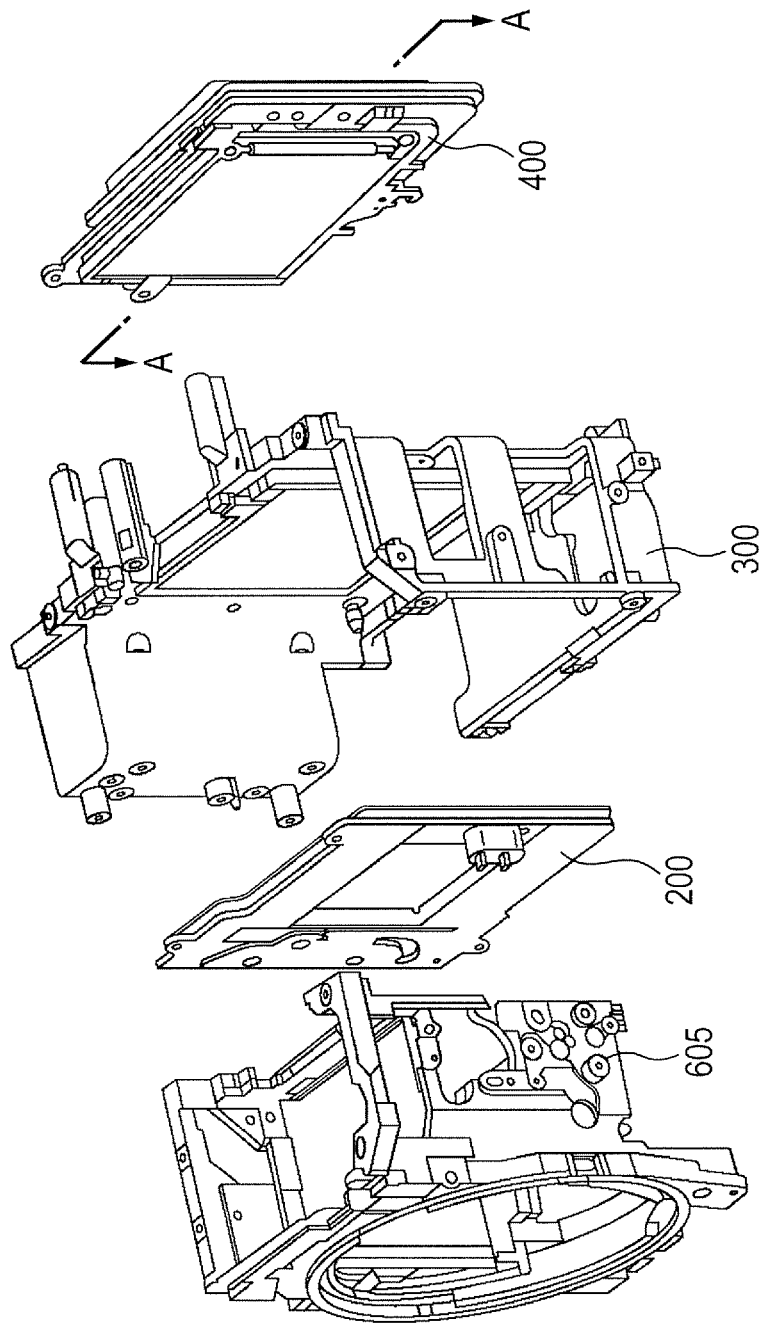
FIG. 13 is a schematic view illustrating the imaging device according to the embodiment of the present invention.

FIG. 11B illustrates a state in which alternating voltages having reverse phases by 180 degrees are applied to the pair of left and right piezoelectric elements 330 so that the out-of-plane oscillation is generated in the diaphragm 320. The dust removing device 310 is driven by the sixth oscillation mode. The dust removing device 310 of the present invention is a device that can effectively remove dust sticking to the surface of the diaphragm by using at least two oscillation modes selectively. Next, an imaging device of the present invention is described. The imaging device of the present invention is an imaging device including at least the dust removing device and an image pickup element unit. The diaphragm of the dust removing device is disposed on a side of a light receiving plane of the image pickup element unit. FIGS. 12 and 13 are diagrams each illustrating a digital single-lens reflex camera as an example of an imaging device according to a preferred embodiment of the present invention.

FIG. 12 is a front side perspective diagram of a camera main body 601 viewed from an object side, in which an imaging lens unit is removed. FIG. 13 is an exploded perspective diagram illustrating an internal schematic configuration of the camera for describing a peripheral structure of the dust removing device and an image pickup unit 400 of the present invention.

A mirror box 605 for guiding an imaging light beam that has passed through the imaging lens is disposed in the camera main body 601, and a main mirror (quick return mirror) 606 is disposed in the mirror box 605. The main mirror 606 can take one of states including a state of being supported at an angle of 45 degrees with respect to an imaging optical axis in order to guide the imaging light beam in the direction to a penta-dach mirror (not shown) and a state of being retreated from the imaging light beam in order to guide the imaging light beam in the direction to an image pickup element (not shown).

On the object side of a main body chassis 300 to be a skeleton of the camera main body, the mirror box 605 and a shutter unit 200 are disposed in order from the object side. In addition, on a photographer side of the main body chassis 300, the image pickup unit 400 is disposed. The image pickup unit 400 is adjusted and disposed so that the imaging surface of the image pickup element is parallel to a mounting surface of a mount portion 602 to be a reference for mounting the imaging lens unit with a predetermined distance.

In this case, the digital single-lens reflex camera is described above as the imaging device of the present invention, but the device may be a camera with interchangeable imaging lens unit such as a mirrorless digital single-lens camera without the mirror box 605, for example. In addition, the present invention can be applied to various types of imaging devices or electronic and electric devices including the imaging device, such as a video camera with interchangeable imaging lens unit, a copying machine, a facsimile, and a scanner, in particular, a device that is required to remove dust sticking to a surface of an optical component.

Next, an electronic apparatus of the present invention is described. The electronic apparatus of the present invention includes a piezoelectric acoustic component including the piezoelectric element or the multilayered piezoelectric element. Examples of the piezoelectric acoustic component include a speaker, a buzzer, a microphone, and a surface acoustic wave (SAW) element.

Figure 14:
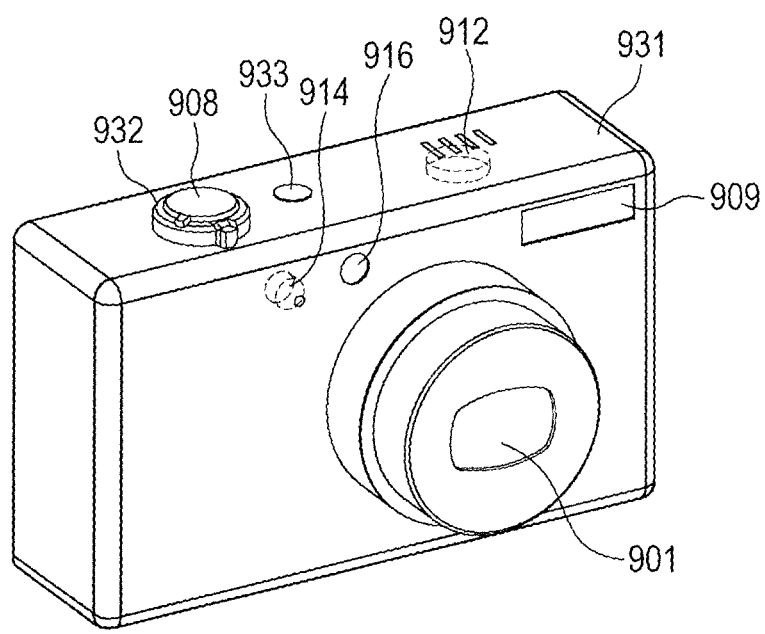
FIG. 14 is a schematic view illustrating an electronic apparatus according to an embodiment of the present invention.

FIG. 14 is a general perspective diagram of a main body 931 of a digital camera as an example of an electronic apparatus according to a preferred embodiment of the present invention, as viewed from the front. On a front surface of the main body 931, there are disposed an optical device 901, a microphone 914, a stroboscopic light emission portion 909, and a fill light portion 916. Because the microphone 914 is installed in the main body, the microphone 914 is illustrated by a broken line. In the front of the microphone 914, there is a hole shape provided for collecting external sound.

A power button 933, a speaker 912, a zoom lever 932, and a release button 908 for performing a focus operation are disposed on the top surface of the main body 931. The speaker 912 is installed in the main body 931 and is illustrated by a broken line. In the front of the speaker 912, there is a hole shape provided for transmitting sound to the outside.

The piezoelectric acoustic component of the present invention is used for at least one of the microphone 914, the speaker 912, and the surface acoustic wave element.

In this case, the digital camera is described above as the electronic apparatus of the present invention, but the present invention can also be applied to various types of the electronic apparatus including the piezoelectric acoustic component, such as a sound reproduction device, a sound recording device, a mobile phone, or an information terminal.

As described above, the piezoelectric element and the multilayered piezoelectric element of the present invention can be preferably used in a liquid discharge head, a liquid discharge device, an ultrasonic motor, an optical device, a vibration device, a dust removing device, an imaging device, and an electronic apparatus.

Through the use of the piezoelectric element and the multilayered piezoelectric element of the present invention, it is possible to provide the liquid discharge head having the same or higher nozzle density and discharge speed than the case where the piezoelectric element containing lead is used.

Through the use of the liquid discharge head of the present invention, it is possible to provide the liquid discharge device having the same or higher discharge speed and discharge accuracy than the case where the piezoelectric element containing lead is used.

Through the use of the piezoelectric element and the multilayered piezoelectric element of the present invention, it is possible to provide the ultrasonic motor having the same or higher driving force and durability than the case where the piezoelectric element containing lead is used.

Through the use of the ultrasonic motor of the present invention, it is possible to provide the optical device having the same or higher durability and operation accuracy than the case where the piezoelectric element containing lead is used.

Through the use of the piezoelectric element and the multilayered piezoelectric element of the present invention, it is possible to provide the vibration device having the same or higher vibration performance and durability than the case where the piezoelectric element containing lead is used.

Through the use of the vibration device of the present invention, it is possible to provide the dust removing device having the same or higher dust-removing efficiency and durability than the case where the piezoelectric element containing lead is used.

Through the use of the dust removing device of the present invention, it is possible to provide the imaging device having the same or higher dust-removing function than the case where the piezoelectric element containing lead is used.

Through the use of the piezoelectric acoustic component including the piezoelectric element or the multilayered piezoelectric element of the present invention, it is possible to provide the electronic apparatus having the same or higher sound producing performance than the case where the piezoelectric element containing lead is used.

The piezoelectric material of the present invention can be used in such a device as an ultrasonic oscillator, a piezoelectric actuator, a piezoelectric sensor, and a ferroelectric memory, as well as the liquid discharge head and the motor.

Hereinafter, the piezoelectric material of the present invention is described more specifically by way of examples. However, the present invention is not limited by the following examples.

The processing and evaluation of piezoelectric materials and intermediate products thereof obtained in Examples and Comparative Examples were performed in the following procedure.

A piezoelectric material for evaluation was polished so that the thickness thereof became about 0.5 mm. The density of the piezoelectric material was evaluated by Archimedes method. When the density was equal to or more than 95% of the theoretical density, it was determined that the piezoelectric material was sufficiently crystallized. The crystal phase and lattice constant of the piezoelectric material were evaluated by X-ray diffraction measurement.

Comparative Examples 1 to 3

A metal oxide material for comparison formed of NN-BT and free of Bi, K, and Cu was produced. Sodium niobate (NaNbO$_3$) powder and barium titanate (BaTiO$_3$) powder were used as raw materials. Sodium niobate (NaNbO$_3$) having a purity of 99% or more was used as the sodium niobate powder, and barium titanate (BaTiO$_3$) having a purity of 99% or more was used as the barium titanate powder.

The raw materials were weighed and mixed so as to obtain an intended composition: Na$_z$Ba$_{1-y}$Nb$_y$Ti$_{1-y}$O$_3$ (y=0.85 (Comparative Example 2), 0.88 (Comparative Example 1), 0.90 (Comparative Example 3)). The mixed powder was calcined at 1,000 to 1,100° C. in the air for 2 to 5 hours. The calcined powder was crushed, and a binder was added thereto, followed by granulation. The granulated powder was filled in a mold and was compressed to manufacture a compact having a diameter of 17 mm and a thickness of about 1 mm. By firing the obtained compact at a maximum temperature of 1,200° C. in the air for 2 to 6 hours, a sintered body was obtained. The surface of the obtained sintered body was observed with an optical microscope to evaluate a grain size. As a result, it was found that the grain size was 0.5 µm to 60 µm.

It was confirmed by X-ray diffraction that the sample was substantially of a perovskite structure single phase. The density of the sintered body was 95% or more of the theoretical density. The composition of the sintered body was evaluated by inductively coupled plasma optical emission spectrometry (ICP). As a result, it was found that sodium was insufficient by about 1% to 5% from the intended composition. On the other hand, the compositions of barium, niobium, and titanium were the same as the intended compositions.

Examples 1 to 4

0.4 mol of Cu was weighed with respect to 1 mol of a perovskite-type metal oxide having an intended composition of (K$_v$Bi$_w$Ba$_{1-v-w}$)$_{1-y}$Na$_x$(Nb$_y$Ti$_{1-y}$)O$_3$, and was mixed with sodium niobate (NaNbO$_3$) powder, barium titanate (BaTiO$_3$) powder, and bismuth potassium titanate ((Bi$_{0.5}$K$_{0.5}$)TiO$_3$) powder that had been weighed so as to achieve the intended composition: (K$_v$Bi$_w$Ba$_{1-v-w}$)$_{1-y}$Na$_x$(Nb$_y$Ti$_{1-y}$)O$_3$ (v=w=0.05 (Example 1), 0.10 (Example 2), 0.20 (Example 3), 0.30 (Example 4), x=0.88, y=0.88).

Sodium niobate (NaNbO$_3$) powder, barium titanate (BaTiO$_3$) powder, and bismuth potassium titanate ((Bi$_{0.5}$K$_{0.5}$)TiO$_3$) powder were used as raw materials. Sodium niobate (NaNbO$_3$) having a purity of 99% or more was used as the sodium niobate powder, barium titanate (BaTiO$_3$) having a purity of 99% or more was used as the barium titanate powder, bismuth potassium titanate ((Bi$_{0.5}$K$_{0.5}$)TiO$_3$) having a purity of 99% or more was used as the bismuth potassium titanate powder, and copper oxide (CuO(II)) having a purity of 99.9% was used as the Cu.

The mixed powder was calcined at 900 to 1,000° C. in the air for 2 to 5 hours. The calcined powder was crushed, and a binder was added thereto, followed by granulation. The granulated powder was filled in a mold and was compressed to manufacture a compact having a diameter of 17 mm and a thickness of about 1 mm. By firing the obtained compact at a maximum temperature of 1,100° C. in the air for 2 to 6 hours, a sintered body was obtained. The surface of the obtained sintered body was observed with an optical microscope to evaluate a grain size.

As a result, it was found that the grain size was 0.5 µm to 50 µm.

When the sintered piezoelectric material was measured by X-ray diffraction, it was confirmed that the sample was substantially of a perovskite structure single phase. The density of the piezoelectric material was 95% or more of the theoretical density. The composition of the piezoelectric material was analyzed by the ICP. As a result, it was found that sodium was insufficient by about 3% to 4% from the intended composition. On the other hand, the compositions of potassium, bismuth, barium, niobium, titanium, and copper were the same as the intended compositions.

Examples 5 to 8

Samples were each produced as the piezoelectric material of the present invention by a method similar to those of Examples 1 to 4. Note that sodium niobate (NaNbO$_3$) powder, barium titanate (BaTiO$_3$) powder, bismuth potassium titanate ((Bi$_{0.5}$K$_{0.5}$)TiO$_3$) powder, and copper oxide (CuO(II)) powder were weighed and mixed so that the relationships: v=w=0.05 (Example 5), 0.10 (Example 6), 0.20 (Example 7), 0.30 (Example 8); y=0.85; and z=0.85 were satisfied. A sintered body was obtained by firing a compact at a maximum temperature of 1,100° C. in the air for 1 to 6 hours. The surface of the obtained sintered body was observed with an optical microscope to evaluate a grain size. As a result, it was found that the grain size was 0.5 µm to 60 µm.

When the sintered piezoelectric material was measured by X-ray diffraction, it was confirmed that the sample was substantially of a perovskite structure single phase. The density of the piezoelectric material was 95% or more of the theoretical density. The composition of the piezoelectric material was analyzed by the ICP. As a result, it was found that sodium was insufficient by about 4% to 5% from the intended composition. On the other hand, the compositions of potassium, bismuth, barium, niobium, titanium, and copper were the same as the intended compositions.

Examples 9 to 12

Samples were each produced as the piezoelectric material of the present invention by a method similar to those of Examples 1 to 8. Note that sodium niobate (NaNbO$_3$) powder, barium titanate (BaTiO$_3$) powder, bismuth potassium titanate ((Bi$_{0.5}$K$_{0.5}$)TiO$_3$) powder, and copper oxide (CuO(II)) powder were weighed and mixed so that the relationships: v=w=0.05 (Example 9), 0.10 (Example 10), 0.20 (Example 11), 0.30 (Example 12); y=0.90; and z=0.90 were satisfied. A sintered body was obtained by firing a compact at a maximum temperature of 1,100° C. in the air for 1 to 6 hours. The surface of the obtained sintered body was observed with an optical microscope to evaluate a grain size. As a result, it was found that the grain size was 0.5 μm to 50 μm.

When the sintered piezoelectric material was measured by X-ray diffraction, it was confirmed that the sample was substantially of a perovskite structure single phase. The density of the piezoelectric material was 95% or more of the theoretical density. The composition of the piezoelectric material was analyzed by the ICP. As a result, it was found that sodium was insufficient by about 1% to 2% from the intended composition. On the other hand, the compositions of potassium, bismuth, barium, niobium, titanium, and copper were the same as the intended compositions.

Comparative Examples 4 to 6

A metal oxide material for comparison was produced by a method similar to those of Examples 1 to 12. Note that powders of raw materials were weighed and mixed so that the relationships: v=w=0.40; and y=z=0.88 (Comparative Example 4), 0.85 (Comparative Example 5), 0.90 (Comparative Example 6) were satisfied. A sintered body was obtained by firing a compact at a maximum temperature of 1,100° C. in the air for 1 to 6 hours. The surface of the obtained sintered body was observed with an optical microscope to evaluate a grain size. As a result, it was found that the grain size was 0.5 μm to 50 μm.

Comparative Example 7

A metal oxide material for comparison was produced by a method similar to those of Examples 1 to 12. Note that powders of raw materials were weighed so that the relationships: v=w=0.40 and y=z=0.88 were satisfied, and 5 mol of Cu was weighed and mixed with respect to 1 mol of a perovskite-type metal oxide having an intended composition: $(K_vBi_wBa_{1-v-w})_{1-y}Na_x(Nb_yTi_{1-y})O_3$. A sintered body was obtained by firing a compact at a maximum temperature of 1,150° C. in the air for 1 to 6 hours. The density of the obtained sintered body was less than 93% of the theoretical density and its insulation resistance was also low owing to the insufficient sintering, with the result that the sintered body was not able to be subjected to polarization treatment.

When the sintered piezoelectric material was measured by X-ray diffraction, it was confirmed that the sample was substantially of a perovskite structure single phase. The density of the piezoelectric material was 93% or more of the theoretical density. The composition of the piezoelectric material was analyzed by the ICP. As a result, it was found that sodium was insufficient by about 1% to 5% from the intended composition. On the other hand, the compositions of potassium, bismuth, barium, niobium, titanium, and copper were the same as the intended compositions.

The surface of each of the piezoelectric materials of Examples 1 to 12 was polished and subjected to heat treatment at 400 to 1,000° C. in the air for 1 hour so as to remove an organic component on the surface. Gold electrodes were formed on front and rear surfaces of the piezoelectric material by DC sputtering to obtain the piezoelectric element of the present invention. The resultant piezoelectric element was processed into a strip shape having a size of 10 mm×2.5 mm×0.5 mm and evaluated for various characteristics.

The metal oxide materials of Comparative Examples 1 to 6 were processed in the same way as in Examples 1 to 12 to obtain elements for comparison. These elements for comparison were evaluated for various characteristics.

For measuring a resistivity, an unpolarized element was used. A direct current bias of 10 V was applied between the two electrodes of the element, and a resistivity was obtained from a leaked current value after 20 seconds. When this resistivity is 1 G Ω·cm or more, preferably 100 G Ω·cm or more, the sample has insulation property sufficient for practical use of a piezoelectric material and a piezoelectric element.

Prior to the evaluation of piezoelectricity, the sample was subjected to polarization treatment. Specifically, the sample was heated to 100° C. to 150° C. in an oil bath, and a voltage of 20 kV/cm was applied to the sample for 30 minutes. Then, the sample was cooled to room temperature while the voltage was applied thereto.

The piezoelectric constant ($d_{31}$) and mechanical quality factor (Qm) of a piezoelectric material were evaluated by a resonance-antiresonance method through use of the strip-shaped piezoelectric element. The temperature at which a relative dielectric constant became a local maximum was measured, and this temperature was defined as a Curie temperature.

Table 1 shows each composition ratio, resistivity, Curie temperature, mechanical quality factor (Qm), Young's modulus ($Y_{11}$), and piezoelectric constant (d31) at a time of charging and after firing of the piezoelectric elements obtained from the piezoelectric materials of Examples 1 to 12 and the elements obtained from the metal oxide materials of Comparative Examples 1 to 6. Regarding the amount Ba, x' represents a composition ratio at a time of charging, and x represents a composition ratio after firing. The y, v and w representing the composition ratios of Nb, K and Bi, and the addition amount of Cu substantially remained unchanged between the time of charging and the time after firing.

TABLE 1

|  | $(K_vBi_wBa_{1-v-w})_{1-y}Na_x(Nb_yTi_{1-y})O_3$ | | | | | Cu | Resistivity | Curie temperature | Mechanical quality factor | Young's modulus | Piezoelectric constant $|d_{31}|$ |
| --- | --- | --- | --- | --- | --- | --- | --- | --- | --- | --- | --- |
|  | x' | x | y | v | w | [mol %] | [GΩ · cm] | [° C.] | [—] | [GPa] | [pC/N] |
| Comparative Example 1 | 0.88 | 0.84 | 0.88 | 0 | 0 | 0 | 0.23 | 190 | 391 | 133 | 53.2 |
| Example 1 | 0.88 | 0.85 | 0.88 | 0.05 | 0.05 | 0.40 | 7.1 | 195 | 584 | 138 | 47.5 |
| Example 2 | 0.88 | 0.85 | 0.88 | 0.10 | 0.10 | 0.40 | 7.4 | 200 | 592 | 139 | 44.8 |
| Example 3 | 0.88 | 0.84 | 0.88 | 0.20 | 0.20 | 0.40 | 5.1 | 205 | 523 | 137 | 40.1 |
| Example 4 | 0.88 | 0.84 | 0.88 | 0.30 | 0.30 | 0.40 | 8.9 | 210 | 315 | 137 | 34.7 |
| Comparative Example 4 | 0.88 | 0.85 | 0.88 | 0.40 | 0.40 | 0.40 | 10 | 165 | 211 | 135 | 24.2 |
| Comparative Example 2 | 0.85 | 0.81 | 0.85 | 0 | 0 | 0 | 5.1 | 140 | 403 | 125 | 51.4 |
| Example 5 | 0.85 | 0.81 | 0.85 | 0.05 | 0.05 | 0.40 | 53 | 145 | 606 | 131 | 46.3 |

TABLE 1-continued

| | $(K_{x'}Bi_yBa_{1-y-w})_{1-x}Na_x(Nb_vTi_{1-v})O_3$ | | | | Cu | Resistivity | Curie temperature | Mechanical quality factor | Young's modulus | Piezoelectric constant $\lvert d_{31}\rvert$ |
|---|---|---|---|---|---|---|---|---|---|---|
| | x' | x | y | v | w | [mol %] | [GΩ·cm] | [° C.] | [—] | [GPa] | [pC/N] |
| Example 6 | 0.85 | 0.82 | 0.85 | 0.10 | 0.10 | 0.40 | 58 | 150 | 615 | 134 | 44.2 |
| Example 7 | 0.85 | 0.82 | 0.85 | 0.20 | 0.20 | 0.40 | 65 | 155 | 550 | 133 | 39.6 |
| Example 8 | 0.85 | 0.81 | 0.85 | 0.30 | 0.30 | 0.40 | 70 | 160 | 341 | 132 | 35.0 |
| Comparative Example 5 | 0.85 | 0.81 | 0.85 | 0.40 | 0.40 | 0.40 | 82 | 120 | 243 | 130 | 23.1 |
| Comparative Example 3 | 0.90 | 0.88 | 0.90 | 0 | 0 | 0 | 10 | 230 | 285 | 119 | 60.1 |
| Example 9 | 0.90 | 0.88 | 0.90 | 0.05 | 0.05 | 0.40 | 160 | 235 | 465 | 125 | 54.7 |
| Example 10 | 0.90 | 0.89 | 0.90 | 0.10 | 0.10 | 0.40 | 160 | 240 | 473 | 127 | 50.9 |
| Example 11 | 0.90 | 0.88 | 0.90 | 0.20 | 0.20 | 0.40 | 160 | 245 | 408 | 125 | 44.9 |
| Example 12 | 0.90 | 0.88 | 0.90 | 0.30 | 0.30 | 0.40 | 160 | 250 | 205 | 124 | 39.8 |
| Comparative Example 6 | 0.90 | 0.89 | 0.90 | 0.40 | 0.40 | 0.40 | 170 | 200 | 113 | 122 | 25.8 |

It is understood from Table 1 that the Curie temperature, mechanical quality factor, and Young's modulus increase by adding Cu and bismuth potassium titanate to the NN-BT. Note that the case where v and w became 0.40 as in Comparative Examples 4 to 6 is not suitable for practical use because the Curie temperature and mechanical quality factor become too low. Further, it is understood from comparisons between Comparative Example 1 and Examples 1 to 4, between Comparative Example 2 and Examples 5 to 8, and between Comparative Example 3 and Examples 9 to 12 that the resistivity is also improved by adding Cu and bismuth potassium titanate to the NN-BT.

Further, the compositions of Comparative Examples 1 to 3 was free of Cu, and hence sufficient insulation resistance was not obtained even when the metal oxide materials were fired at a temperature lower than 1,200° C., with the result that the elements were not able to be subjected to polarization treatment.

Example 13

Powders of raw materials were subjected to wet mixing and dehydration drying in the same way as in Example 2, followed by calcination at 900° C. to 1,000° C. to obtain a calcined product. An organic binder was added to the resultant raw material, followed by mixing, and thereafter, a sheet was formed by a doctor blade method to obtain a green sheet having a thickness of 50 μm.

A conductive paste for an internal electrode was printed onto the green sheet. As the conductive paste, an alloy containing 70% of Ag and 30% of Pd was used. Nine green sheets coated with the conductive paste thus produced were stacked, and the multilayered body was fired at 1,140° C. to obtain a sintered body. The sintered body thus obtained was cut to a size of 10 mm×2.5 mm, and side surfaces thereof were then polished. A pair of external electrodes (first electrode and second electrode) for short-circuiting internal electrodes alternately was formed by Au sputtering to produce a multilayered piezoelectric element as illustrated in FIG. 2B.

The internal electrodes of the obtained multilayered piezoelectric element were observed. As a result, it was found that Ag—Pd as an electrode material and a piezoelectric material layer were formed alternately.

Prior to the evaluation of piezoelectricity, the sample was subjected to polarization treatment. Specifically, the sample was heated to 100° C. to 150° C. on a hot plate. A voltage of 20 kV/cm was applied between the first electrode and the second electrode for 30 minutes, and the sample was cooled to room temperature while the voltage was applied thereto.

The piezoelectricity was evaluated. As a result, it was found that the sample had sufficient insulation property and satisfactory piezoelectric property equivalent to that of the piezoelectric material of Example 4 was obtained.

Comparative Example 8

Powders of raw materials were subjected to wet mixing and dehydration drying in the same way as in Comparative Example 1, followed by calcination at 1,000° C. to 1, 100° C. to obtain a calcined product. An organic binder was added to the resultant raw material, followed by mixing, and thereafter, a sheet was formed by a doctor blade method to obtain a green sheet having a thickness of 50 μm.

A conductive paste for an internal electrode was printed onto the green sheet. As the conductive paste, an alloy containing 70% of Ag and 30% of Pd was used. Nine green sheets coated with the conductive paste thus produced were stacked, and the multilayered body was fired at 1,280° C. to obtain a sintered body. The sintered body thus obtained was processed in the same way as in Example 13 to produce a multilayered piezoelectric element as illustrated in FIG. 2B.

The internal electrodes of the obtained multilayered piezoelectric element were observed. As a result, it was found that Ag—Pd as an electrode material was melted due to the high sintering temperature, and Ag and Pd were dispersed in the piezoelectric material layer. Further, a resistivity between the pair of external electrodes of the element was low, i.e., $10^6$ Ω·cm or less, and hence a piezoelectric constant was not able to be measured.

Comparative Example 9

A green sheet having a thickness of 50 μm was obtained in the same way as in Comparative Example 8.

A conductive paste for an internal electrode was printed onto the green sheet. As the conductive paste, an alloy containing 95% of Ag and 5% of Pd was used. Nine green sheets coated with the conductive paste thus produced were stacked, and the multilayered body was fired at 1,300° C. to obtain a sintered body. The sintered body thus obtained was processed in the same way as in Example 13 to produce a multilayered piezoelectric element as illustrated in FIG. 2B.

The internal electrodes of the obtained multilayered piezoelectric element were observed. As a result, it was found that the internal electrodes were melted and scatted like islands. Thus, the internal electrodes were not brought into conduction, and hence the multilayered piezoelectric element was not able to be subjected to polarization treatment. Therefore, a piezoelectric constant was not able to be measured.

Example 14

Sodium niobate powder, barium titanate powder, and barium zirconate powder were weighed so that Na, Nb, Ba, and Zr had the compositions described in Example 2 in Table 1. The weighed raw material powders were mixed overnight with a ball mill. To these weighed powders, 3 parts by weight of a PVB binder were added and mixed. A sheet was formed by a doctor blade method through use of the mixed powder to obtain a green sheet having a thickness of 50 μm.

A conductive paste for an internal electrode was printed on the green sheet. As the conductive paste, an Ni paste was used. Nine green sheets coated with the conductive paste were stacked, and the multilayered body was subjected to thermocompression bonding.

The multilayered body subjected to thermocompression bonding was fired in a tubular furnace. The firing was performed in the atmosphere up to 300° C. to remove the binder. After that, the atmosphere was changed to a reducing atmosphere ($H_2:N_2=2:98$, oxygen concentration: $2\times10^{-6}$ Pa) and held at 1,200° C. for 5 hours. In the temperature decrease step, the oxygen concentration was changed to 30 Pa at 1,000° C. or less, and the multilayered body was cooled to room temperature.

The thus obtained sintered body was cut to a size of 10 mm×2.5 mm, and side surfaces thereof were polished. A pair of external electrodes (first electrode and second electrode) for short-circuiting internal electrodes alternately was formed by Au sputtering to produce a multilayered piezoelectric element as illustrated in FIG. 3B.

The internal electrodes of the obtained multilayered piezoelectric element were observed. As a result, it was found that Ni as an electrode material and a piezoelectric material layer were formed alternately. The obtained multilayered piezoelectric element was subjected to polarization treatment by applying an electric field of 2 kV/mm to the multilayered piezoelectric element in an oil bath held at 150° C. for 30 minutes. The piezoelectric property of the obtained multilayered piezoelectric element was evaluated. As a result, sufficient insulation property was obtained, and satisfactory piezoelectric property equivalent to that of the piezoelectric element of Example 2 was obtained.

Example 15

Through the use of the piezoelectric element of Example 2, the liquid discharge head illustrated in FIGS. 3A and 3B was manufactured. It was confirmed that ink was discharged in accordance with an input electric signal.

Example 16

Through the use of the liquid discharge head of Example 15, the liquid discharge device illustrated in FIG. 4 was manufactured. It was confirmed that ink was discharged on a recording medium in accordance with an input electric signal.

Example 17

Through the use of the piezoelectric element of Example 2, the ultrasonic motor illustrated in FIG. 6A was manufactured. It was confirmed that the motor rotated in accordance with an applied alternating voltage.

Example 18

Through the use of the ultrasonic motor of Example 17, the optical device illustrated in FIGS. 7A and 7B was manufactured. It was confirmed that the automatic focus operation was performed in accordance with an applied alternating voltage.

Example 19

Through the use of the piezoelectric element of Example 2, the dust removing device illustrated in FIGS. 9A and 9B was manufactured. Plastic beads were scattered, and an alternating voltage was applied. Then, satisfactory dust removing efficiency was confirmed.

Example 20

Through the use of the dust removing device of Example 19, the imaging device illustrated in FIG. 12 was manufactured. During operation, the dust on the surface of the image pickup unit was satisfactorily removed, and an image without a dust defect was obtained.

Example 21

Through the use of the multilayered piezoelectric element of Example 13, the liquid discharge head illustrated in FIGS. 3A and 3B was manufactured. It was confirmed that ink was discharged in accordance with an input electric signal.

Example 22

Through the use of the liquid discharge head of Example 21, the liquid discharge device illustrated in FIG. 4 was manufactured. It was confirmed that ink was discharged on a recording medium in accordance with an input electric signal.

Example 23

Through the use of the multilayered piezoelectric element of Example 13, the ultrasonic motor illustrated in FIG. 6B was manufactured. It was confirmed that the motor rotated in accordance with an applied alternating voltage.

Example 24

Through the use of the ultrasonic motor of Example 23, the optical device illustrated in FIGS. 7A and 7B was manufactured. It was confirmed that the automatic focus operation was performed in accordance with an applied alternating voltage.

Example 25

Through the use of the multilayered piezoelectric element of Example 13, the dust removing device illustrated in FIGS. 9A and 9B was manufactured. Plastic beads were scattered, and an alternating voltage was applied. Then, satisfactory dust removing efficiency was confirmed.

Example 26

Through the use of the dust removing device of Example 25, the imaging device illustrated in FIG. 12 was manufactured. During operation, the dust on the surface of the image pickup unit was satisfactorily removed, and an image without a dust defect was obtained.

Example 27

Through the use of the multilayered piezoelectric element of Example 13, the electronic apparatus illustrated in FIG.

14 was manufactured. It was confirmed that the speaker operated in accordance with an applied alternating voltage.

INDUSTRIAL APPLICABILITY

The piezoelectric material of the present invention expresses satisfactory piezoelectricity even at high ambient temperature. The piezoelectric material of the present invention has a small load on the environment because it is free of lead. Accordingly, the lead-free piezoelectric material of the present invention can be used without any problem for devices using a great amount of piezoelectric material such as a liquid discharge head, a liquid discharge device, an ultrasonic motor, an optical device, a vibration device, a dust removing device, an imaging device, and an electronic apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-186643, filed Aug. 27, 2012, which is hereby incorporated by reference herein in its entirety.

REFERENCE SIGNS LIST 1 first electrode
2 piezoelectric material portion
3 second electrode
101 piezoelectric element
102 individual liquid chamber
103 diaphragm
104 liquid chamber partition wall
105 ejection port
106 communicating hole
107 common liquid chamber
108 buffer layer
1011 first electrode
1012 piezoelectric material
1013 second electrode
201 oscillator
202 rotor
203 output shaft
204 oscillator
205 rotor
206 spring
2011 elastic ring
2012 piezoelectric element
2013 organic adhesive
2041 metal elastic body
2042 multilayered piezoelectric element
310 dust removing device
330 piezoelectric element
320 diaphragm
330 piezoelectric element
331 piezoelectric material
332 first electrode
333 second electrode
336 first electrode plane
337 second electrode plane
310 dust removing device
320 diaphragm
330 piezoelectric element
51 first electrode
53 second electrode
54 piezoelectric material layer
555 internal electrode
501 first electrode
503 second electrode
504 piezoelectric material layer
505a internal electrode
505b internal electrode
506a external electrode
506b external electrode
601 camera main body
602 mount portion
605 mirror box
606 main mirror
200 shutter unit
300 main body chassis
400 image pickup unit
701 front unit lens
702 rear unit lens (focus lens)
711 attaching/detaching mount
712 fixed barrel
713 linear guide barrel
714 front unit barrel
715 cam ring
716 rear unit barrel
717 cam roller
718 axial screw
719 roller
720 rotation transmission ring
722 roller
724 manual focus ring
725 ultrasonic motor
726 waved washer
727 ball race
728 focus key
729 joining member
732 washer
733 low friction sheet
881 liquid discharge device
882 sheathing
883 sheathing
884 sheathing
885 sheathing
887 sheathing
890 recovery portion
891 recording portion
892 carriage
896 device main body
897 automatic sheet feeder portion
898 exhaust port
899 conveyance portion
901 optical device
908 release button
909 stroboscopic light emission portion
912 speaker
916 microphone
916 fill light portion
931 main body
932 zoom lever
933 power button

The invention claimed is:
1. A piezoelectric material comprising:
a perovskite-type metal oxide represented by general formula (1):

$$(K_v Bi_w Ba_{1-v-w})_{1-y} Na_x (Nb_y Ti_{1-y}) O_3 \qquad (1),$$

where relationships of $0<v\leq 0.39$, $0<w\leq 0.39$, $0.9\leq w/v\leq 1.1$, $0.80\leq x<0.95$, $0.85\leq y\leq 0.95$, and $x<y$ are satisfied; and 0.04 mol % to 2.00 mol % of Cu with respect to 1 mol of the perovskite-type metal oxide.

2. The piezoelectric material according to claim 1, wherein the piezoelectric material satisfies relationships of $0<v\leq 0.05$ and $0<w\leq 0.05$ in the general formula (1).

3. A piezoelectric element comprising:
a first electrode;
a piezoelectric material; and
a second electrode,
wherein the piezoelectric material comprises the piezoelectric material according to claim 1.

4. A multilayered piezoelectric element comprising a piezoelectric material layer and an electrode layer comprising an internal electrode, which are alternately stacked,
wherein the piezoelectric material layer comprises the piezoelectric material according to claim 1.

5. The multilayered piezoelectric element according to claim 4, wherein the internal electrode comprises Ag and Pd, and a weight ratio M1/M2 of a content weight M1 of the Ag to a content weight M2 of the Pd satisfies a relationship of $1.5\leq M1/M2\leq 9.0$.

6. The multilayered piezoelectric element according to claim 4, wherein the internal electrode contains at least one of Ni and Cu.

7. A manufacturing method for the multilayered piezoelectric element as defined in claim 4, comprising:
a step (A) of obtaining a slurry by dispersing a metal compound containing at least one of K, Bi, Ba, Na, Nb, Ti, and Cu;
a step (B) of obtaining a compact from the slurry;
a step (C) of forming an electrode on the compact; and
a step (D) of obtaining the multilayered piezoelectric element by sintering a compact in which the compact containing the metal compound and the electrode are stacked alternately,
the step (D) being performed at a sintering temperature of 1,150° C. or less.

8. A liquid discharge head comprising:
a liquid chamber comprising a vibration portion including the piezoelectric element according to claim 3; and
an ejection port communicating to the liquid chamber.

9. A liquid discharge device comprising:
a conveyance portion for a recording medium; and
the liquid discharge head according to claim 8.

10. An ultrasonic motor comprising:
a vibration body including the piezoelectric element according to claim 3; and
a moving body to be brought into contact with the vibration body.

11. An optical device comprising a drive portion including the ultrasonic motor according to claim 10.

12. A vibration device comprising a vibration body including a diaphragm including the piezoelectric element according to claim 3.

13. A dust removing device comprising a vibration portion including the vibration device according to claim 12.

14. An imaging device comprising:
the dust removing device according to claim 13; and
an image pickup element unit,
wherein the diaphragm of the dust removing device is disposed on a light receiving plane side of the image pickup element unit.

15. An electronic apparatus, comprising a piezoelectric acoustic component including the piezoelectric element according to claim 3.

16. A liquid discharge head comprising:
a liquid chamber comprising a vibration portion including the multilayered piezoelectric element according to claim 4; and
an ejection port communicating to the liquid chamber.

17. A liquid discharge device comprising:
a conveyance portion for a recording medium; and
the liquid discharge head according to claim 16.

18. An ultrasonic motor comprising:
a vibration body including the multilayered piezoelectric element according to claim 4; and
a moving body to be brought into contact with the vibration body.

19. An optical device comprising a drive portion including the ultrasonic motor according to claim 18.

20. A vibration device comprising a vibration body including a diaphragm including the multilayered piezoelectric element according to claim 4.

21. A dust removing device comprising a vibration portion including the vibration device according to claim 20.

22. An imaging device comprising:
the dust removing device according to claim 21; and
an image pickup element unit,
wherein the diaphragm of the dust removing device is disposed on a light receiving plane side of the image pickup element unit.

23. An electronic apparatus, comprising a piezoelectric acoustic component including the multilayered piezoelectric element according to claim 4.

* * * * *